United States Patent
Park et al.

(10) Patent No.: US 11,716,891 B2
(45) Date of Patent: Aug. 1, 2023

(54) ORGANIC LIGHT EMITTING DISPLAY MODULE AND ORGANIC LIGHT EMITTING DISPLAY DEVICE HAVING THE SAME

(71) Applicant: Samsung Display Co., Ltd., Yongin-Si (KR)

(72) Inventors: Yong-hwan Park, Cheonan-si (KR); Jongseok Kim, Yongin-si (KR); Miyoung Kim, Daegu (KR); Chiwook An, Hwaseong-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 0 days.

(21) Appl. No.: 17/980,604

(22) Filed: Nov. 4, 2022

(65) Prior Publication Data

US 2023/0059081 A1    Feb. 23, 2023

Related U.S. Application Data

(63) Continuation of application No. 17/327,846, filed on May 24, 2021, now Pat. No. 11,522,020, which is a
(Continued)

(30) Foreign Application Priority Data

Aug. 2, 2016  (KR) .................. 10-2016-0098607

(51) Int. Cl.
  *H10K 59/40*   (2023.01)
  *G06F 1/16*    (2006.01)
  (Continued)

(52) U.S. Cl.
  CPC ........... *H10K 59/40* (2023.02); *G06F 1/1643* (2013.01); *G06F 1/1652* (2013.01);
  (Continued)

(58) Field of Classification Search
  CPC .............. H01L 27/323; H01L 51/0097; H01L 2251/5338; G06F 1/1652; G06F 3/0412; G06F 2203/04102; G06F 2203/04103
  See application file for complete search history.

(56) References Cited

U.S. PATENT DOCUMENTS

7,936,121 B2   5/2011  Kim
8,199,127 B2   6/2012  Mamba et al.
(Continued)

FOREIGN PATENT DOCUMENTS

CN   104679369 A   6/2015
CN   105074802 A   11/2015
(Continued)

OTHER PUBLICATIONS

Chinese Office Action Report, Application No. 201710638744.X dated Apr. 8, 2021, 7 pages.

*Primary Examiner* — Michael Pervan
(74) *Attorney, Agent, or Firm* — Innovation Counsel LLP

(57) ABSTRACT

Provided is an organic light emitting display module including an active area, a pad area, and a boundary area between the active area and the pad area. Unlike the active area and the pad area, since the boundary area does not include an inorganic layer, less stress is applied to the boundary area when the boundary area is bent. Display panel pads and touch sensing member pads are disposed at the same height without having a height difference therebetween. Thus, a dummy pad may be added to remove the height difference between the display panel pads and the touch sensing member pads.

13 Claims, 43 Drawing Sheets

Related U.S. Application Data continuation of application No. 16/870,832, filed on May 8, 2020, now Pat. No. 11,018,205, which is a continuation of application No. 16/562,479, filed on Sep. 6, 2019, now Pat. No. 10,651,246, which is a continuation of application No. 15/667,429, filed on Aug. 2, 2017, now Pat. No. 10,418,425.

(51) Int. Cl.
*G06F 3/044* (2006.01)
*H10K 59/88* (2023.01)
*H10K 59/131* (2023.01)
*H10K 77/10* (2023.01)
*G06F 3/041* (2006.01)
*H10K 102/00* (2023.01)

(52) U.S. Cl.
CPC .......... *G06F 3/0412* (2013.01); *G06F 3/0443* (2019.05); *G06F 3/0446* (2019.05); *H10K 59/131* (2023.02); *H10K 59/88* (2023.02); *H10K 77/111* (2023.02); *G06F 2203/04102* (2013.01); *G06F 2203/04103* (2013.01); *G06F 2203/04111* (2013.01); *G06F 2203/04112* (2013.01); *H10K 2102/311* (2023.02); *Y02E 10/549* (2013.01)

(56) References Cited

U.S. PATENT DOCUMENTS

| | | | |
|---|---|---|---|
| 9,046,955 | B1 | 6/2015 | Lee et al. |
| 9,299,952 | B2 | 3/2016 | Jung et al. |
| 9,395,831 | B2 | 7/2016 | Kim et al. |
| 9,417,474 | B2 | 8/2016 | Choi et al. |
| 9,735,389 | B2 | 8/2017 | Lee |
| 9,798,434 | B2 | 10/2017 | Lee et al. |
| 10,043,421 | B2 | 8/2018 | Ko et al. |
| 10,256,431 | B2 | 4/2019 | Kim et al. |
| 10,340,317 | B2 | 7/2019 | Oh et al. |
| 10,505,142 | B2 | 12/2019 | Oh |
| 10,671,122 | B2 | 6/2020 | Ko et al. |
| 2005/0110023 | A1 | 5/2005 | Lee et al. |
| 2012/0044191 | A1 | 2/2012 | Shin |
| 2014/0117316 | A1 | 5/2014 | Choi |
| 2015/0286325 | A1 | 10/2015 | Kim |
| 2015/0331453 | A1 | 11/2015 | Kim et al. |
| 2016/0020264 | A1 | 1/2016 | Choo et al. |
| 2016/0103537 | A1 | 4/2016 | Park et al. |
| 2016/0124556 | A1 | 5/2016 | Choi et al. |
| 2016/0218305 | A1 | 7/2016 | Kim et al. |
| 2018/0033979 | A1 | 2/2018 | Jang et al. |

FOREIGN PATENT DOCUMENTS

| | | |
|---|---|---|
| CN | 105810104 A | 7/2016 |
| KR | 10-2009-0092695 A | 9/2009 |
| KR | 10-2012-0045291 A | 5/2012 |
| KR | 10-2013-0071999 A | 7/2013 |
| KR | 10-2013-0118072 A | 10/2013 |
| KR | 2014-0057426 A | 5/2014 |
| KR | 10-2014-0098438 A | 8/2014 |
| KR | 10-2014-0142380 A | 12/2014 |
| KR | 10-2015-0001019 A | 1/2015 |
| KR | 10-2016-0043230 A | 4/2016 |
| KR | 10-2016-0072372 A | 6/2016 |
| KR | 10-2016-0090473 A | 8/2016 |

ORGANIC LIGHT EMITTING DISPLAY MODULE AND ORGANIC LIGHT EMITTING DISPLAY DEVICE HAVING THE SAME

CROSS-REFERENCE TO RELATED APPLICATIONS

This U.S. application is a continuation application of U.S. patent application Ser. No. 17/327,846 filed on May 24, 2021, which is a continuation application of U.S. patent application Ser. No. 16/870,832 filed on May 8, 2020 (now U.S. Pat. No. 11,018,205), which is a continuation application of U.S. patent application Ser. No. 16/562,479 filed on Sep. 6, 2019 (now U.S. Pat. No. 10,651,246), which is a continuation application of U.S. patent application Ser. No. 15/667,429 filed on Aug. 2, 2017 (now U.S. Pat. No. 10,418,425), which claims priority under 35 USC § 119 to Korean Patent Application No. 10-2016-0098607, filed on Aug. 2, 2016, the entire contents of which in their entirety are herein incorporated by reference.

BACKGROUND

1. Field of Disclosure

The present disclosure herein relates to a display device, and more particularly, to a display device with which a touch sensing unit is integrated.

2. Description of the Related Art

Various display devices used in multimedia devices such as televisions, mobile phones, table computers, navigation devices, and game consoles are being developed. Such a display device includes a keyboard or a mouse as an input unit. Also, in recent years, the display device includes a touch sensing member as an input unit.

SUMMARY

The present disclosure provides a display device in which a stepped portion between a pad unit of a display panel and a pad unit of a touch sensing member is removed to reduce defects occurring in a manufacturing process.

The present disclosure also provides a display device having improved reliability when a boundary area between an active area and a pad area on a display panel is bent.

An embodiment of the inventive concept provides an organic light emitting display module including a base layer, a first circuit layer, a device layer, an encapsulation layer, a plurality of touch electrodes, a second circuit layer, and a boundary layer. The base layer includes an active area, a pad area, and a boundary area between the active area and the pad area. The device layer is disposed on the first circuit layer and includes an organic light emitting device configured to generate light by using an electrical signal provided from the first conductive pattern. The encapsulation layer is disposed on the device layer. The plurality of touch electrodes are disposed on the encapsulation layer. The second circuit layer is disposed on the pad area of the base layer and includes a plurality of inorganic layers and a second conductive pattern. The boundary layer disposed on the boundary area of the base layer and comprising an organic layer and a third conductive pattern configured to electrically connect the first conductive pattern to the second conductive pattern. The boundary layer may not include an inorganic layer disposed on the base layer.

In an embodiment, the plurality of inorganic layers of the first circuit layer may include a first functional layer contacting the base layer, and the plurality of inorganic layers of the second circuit layer may include a second functional layer directly contacting the base layer.

In an embodiment, the second conductive pattern may include a display panel pad and a touch sensing member pad. The display panel pad may be disposed on the second functional layer and electrically connected to the first conductive pattern. The touch sensing member pad may be disposed adjacent to the display panel pad on the second functional layer, electrically connected to the plurality of touch electrodes, and insulated from the first conductive pattern.

In an embodiment, the display panel pad may include: a lower display panel pad; and an upper display panel pad disposed on the lower display panel pad and electrically connected to the lower display panel pad.

In an embodiment, the touch sensing member pad may include: a lower touch sensing member pad; and an upper touch sensing member pad disposed on the lower touch sensing member pad.

In an embodiment, the first conductive pattern may include a transistor including a control electrode, an input electrode, and an output electrode, and the input electrode, the output electrode, the lower display panel pad, and the lower touch sensing member pad may be disposed on the same layer.

In an embodiment, the second conductive pattern may further include a dummy electrode disposed on the same layer as the control electrode.

In an embodiment, the organic light emitting display module may further include a touch signal line extending from at least one of the plurality of touch electrodes to contact the upper touch sensing member pad.

In an embodiment, the second circuit layer may further include a plurality of insulation layers disposed between the upper display panel pad and the lower display panel pad, and the plurality of insulation layers may be disposed between the upper touch sensing member pad and the lower touch sensing member pad.

In an embodiment, the lower touch sensing member pad may be electrically isolated.

In an embodiment, the lower touch sensing member pad may be electrically connected to the upper touch sensing member pad.

In an embodiment, the upper display panel pad may contact the lower display panel pad, and the lower touch sensing member pad may contact the lower touch sensing member pad.

In an embodiment, the first functional layer and the second functional layer may respectively include a barrier layer and a buffer layer.

In an embodiment, the organic light emitting display module may further include a driving circuit overlapping the pad area and configured to control an electrical signal flow between the display panel pad and the first conductive pattern.

In an embodiment, the first circuit layer may further include an organic layer disposed on the first conductive pattern, and the boundary layer may further include an organic layer disposed on the third conductive pattern.

In an embodiment, the boundary area and the boundary layer of the base layer may be bendable.

In an embodiment of the inventive concept, an organic light emitting display device includes an organic light emitting display panel and a touch sensing member disposed on the organic light emitting display panel.

In an embodiment, the organic light emitting display panel may include a base layer, a conductive pattern, a device layer, and an encapsulation layer. The base layer may include an active area, a pad area, and a boundary area between the active area and the pad area. The conductive pattern may overlap the active area, disposed on the base layer, be formed through a low temperature poly Si (LTPS) process, and include a display panel pad and a touch sensing member pad disposed adjacent to the display panel pad, wherein the touch sensing member pad and the display panel pad may receive an electrical signal from the outside. The device layer may be disposed on the conductive pattern and include an organic light emitting device configured to generate light by using the electrical signal provided from the conductive pattern. The encapsulation layer may be disposed on the device layer.

In an embodiment, the touch sensing member may include a plurality of touch electrodes and a plurality of touch signal lines. The plurality of touch electrodes may be disposed on the encapsulation layer. The plurality of touch signal lines may extend from the plurality of touch electrodes and be electrically connected to the conductive pattern, wherein portions of the touch signal lines, which overlap the boundary area, may be disposed between two organic layers.

In an embodiment, the organic light emitting display device may further include a printed circuit board electrically connected to the touch sensing member pad and the display panel pad, wherein portions of the organic light emitting display panel and the touch sensing member, which overlap the boundary area, may be bent.

In an embodiment of the inventive concept, an organic light emitting display module includes a base layer, a first functional layer, a plurality of transistors, a device layer, an encapsulation layer, a plurality of touch electrodes, a second functional layer, a first display panel pad, a first touch sensing member pad, a second display panel pad, a second touch sensing member pad, and a boundary layer.

In an embodiment, the base layer may include an active area, a pad area, and a boundary area between the active area and the pad area. The first functional layer may be disposed on the active area of the base layer and include an inorganic material. The plurality of transistors may be disposed on the first functional layer. The device layer may include an organic light emitting device configured to generate light by using an electrical signal provided from at least one of the plurality of transistors. The encapsulation layer may be disposed on the device layer and include an organic material and an inorganic material. The plurality of touch electrodes may be disposed on the encapsulation layer. The second functional layer may be disposed on the pad area of the base layer and include an inorganic material. The first display panel pad may be disposed on the second functional layer and electrically connected to at least one of the plurality of transistors. The first touch sensing member pad may be disposed adjacent to the first display panel pad on the second functional layer and insulated from the plurality of transistors. The second display panel pad may be disposed on the first display panel pad and electrically connected to the first display panel pad. The second touch sensing member pad may be disposed on the first touch sensing member pad and electrically connected to at least one of the plurality of touch electrodes. The boundary layer may be disposed on the boundary area of the base layer and include an organic material. The boundary layer does not include an inorganic layer disposed on the base layer.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1A:
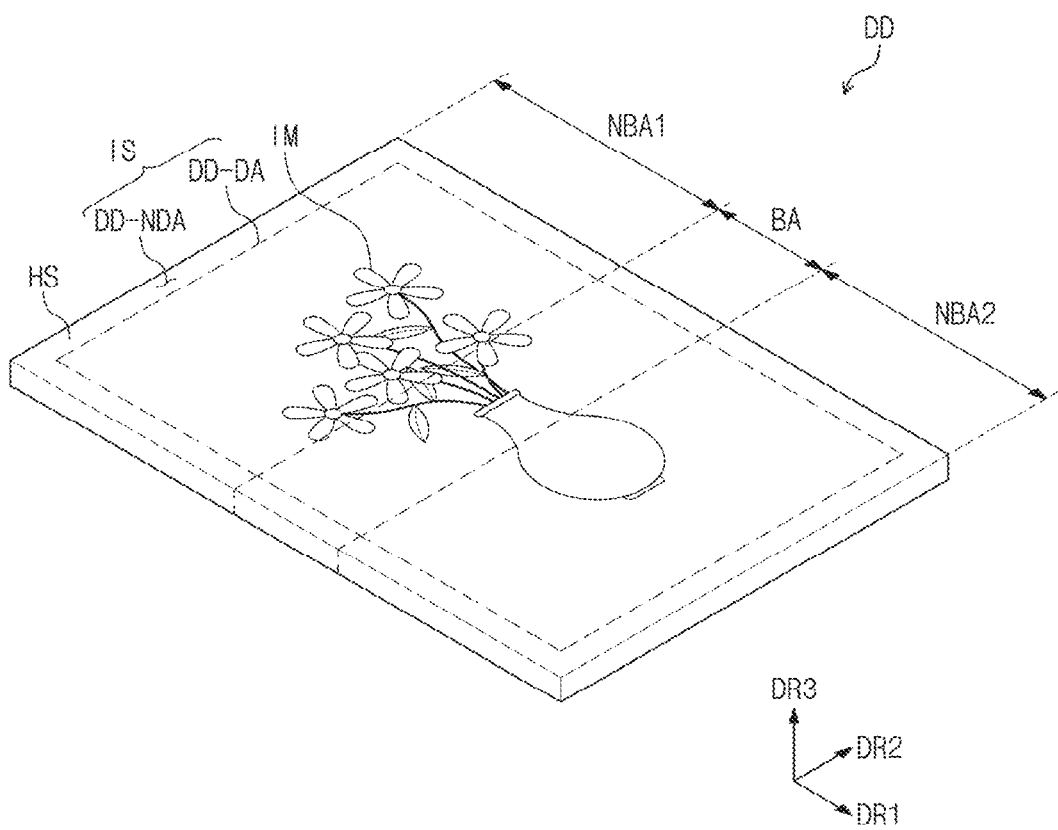
FIG. 1A is a perspective view illustrating a first operation of a display device according to an embodiment of the inventive concept.

Hereinafter, embodiments of the inventive concept will be described with reference to the accompanying drawings. In this specification, it will also be understood that when one component (or region, layer, portion) is referred to as being 'on', 'connected to', or 'coupled to' another component, it can be directly disposed/connected/coupled on/to the one component, or an intervening third component may also be present.

Like reference numerals refer to like elements throughout. Also, in the figures, the thickness, ratio, and dimensions of components are exaggerated for clarity of illustration. The term "and/or" includes any and all combinations of one or more of the associated listed items.

It will be understood that although the terms such as 'first' and 'second' are used herein to describe various elements, these elements should not be limited by these terms. The terms are only used to distinguish one component from other components. For example, a first element referred to as a first element in one embodiment can be referred to as a second element in another embodiment without departing from the scope of the appended claims. The terms of a singular form may include plural forms unless referred to the contrary.

Also, ""under", "below", "above', "upper", and the like are used for explaining relation association of components illustrated in the drawings. The terms may be a relative concept and described based on directions expressed in the drawings.

The meaning of 'include' or 'comprise' specifies a property, a fixed number, a step, an operation, an element, a component or a combination thereof, but does not exclude other properties, fixed numbers, steps, operations, elements, components or combinations thereof.

Figure 1B:
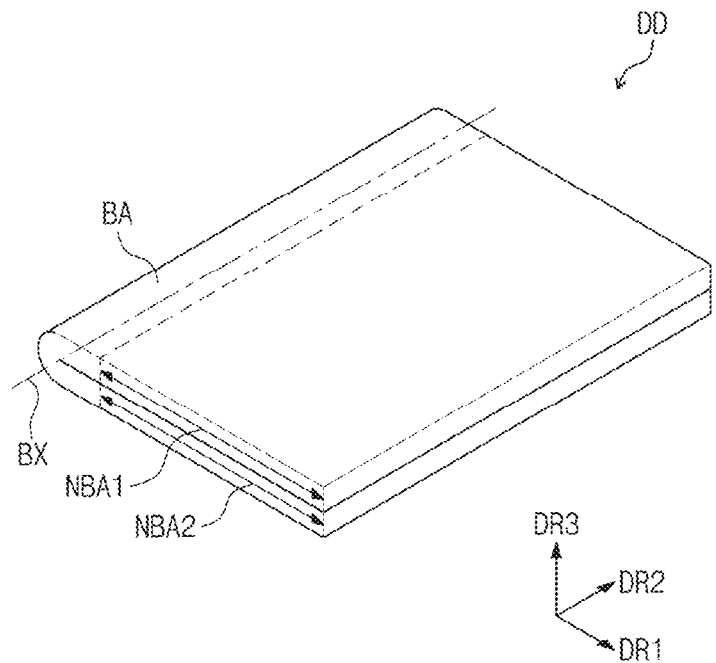
FIG. 1B is a perspective view illustrating a second operation of the display device according to an embodiment of the inventive concept.
Figure 1C:
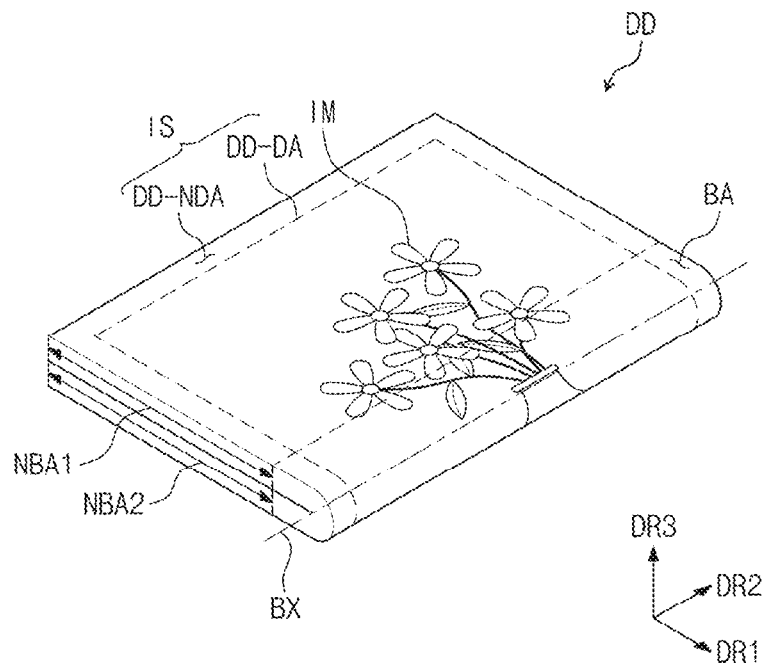
FIG. 1C is a perspective view illustrating a third operation of the display device according to an embodiment of the inventive concept.

FIG. 1A is a perspective view illustrating a first operation of a display device DD according to an embodiment of the inventive concept. FIG. 1B is a perspective view illustrating a second operation of the display device DD according to an embodiment of the inventive concept. FIG. 1C is a perspective view illustrating a third operation of the display device DD according to an embodiment of the inventive concept.

As illustrated in FIG. 1A, in a first operation mode, a display surface IS on which an image IM is displayed is parallel to a surface that is defined by a first directional axis DR1 and a second directional axis DR2. A normal direction of the display surface IS, i.e., a thickness direction of the display device DD, is indicated as a third directional axis DR3. A front surface (or top surface) and a rear surface (or bottom surface) of each members are distinguished by the third directional axis DR3. However, directions indicated as the first to third directional axes DR1, DR2, and DR3 may be a relative concept and thus changed into different directions. Hereinafter, the first to third directions may be directions indicated by the first to third directional axes DR1, DR2, and DR3 and designated by the same reference numerals, respectively. Although a flexible display device is illustrated in the current embodiment, the embodiment of the inventive concept is not limited thereto. The display device DD according to the current embodiment may be a rigid display device.

Figure 2A:
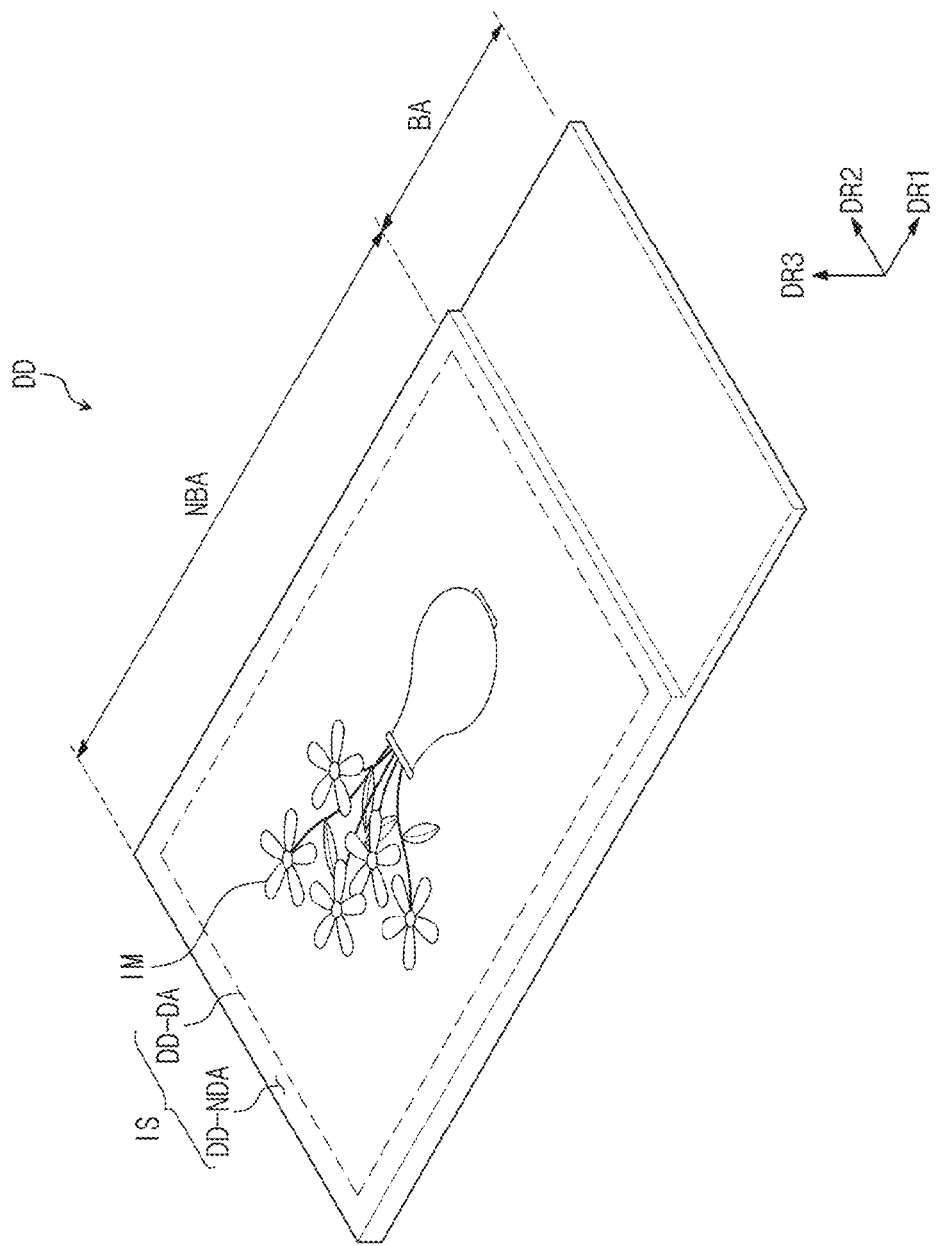
FIG. 2A is a perspective view illustrating a first operation of a display device according to an embodiment of the inventive concept.
Figure 2B:
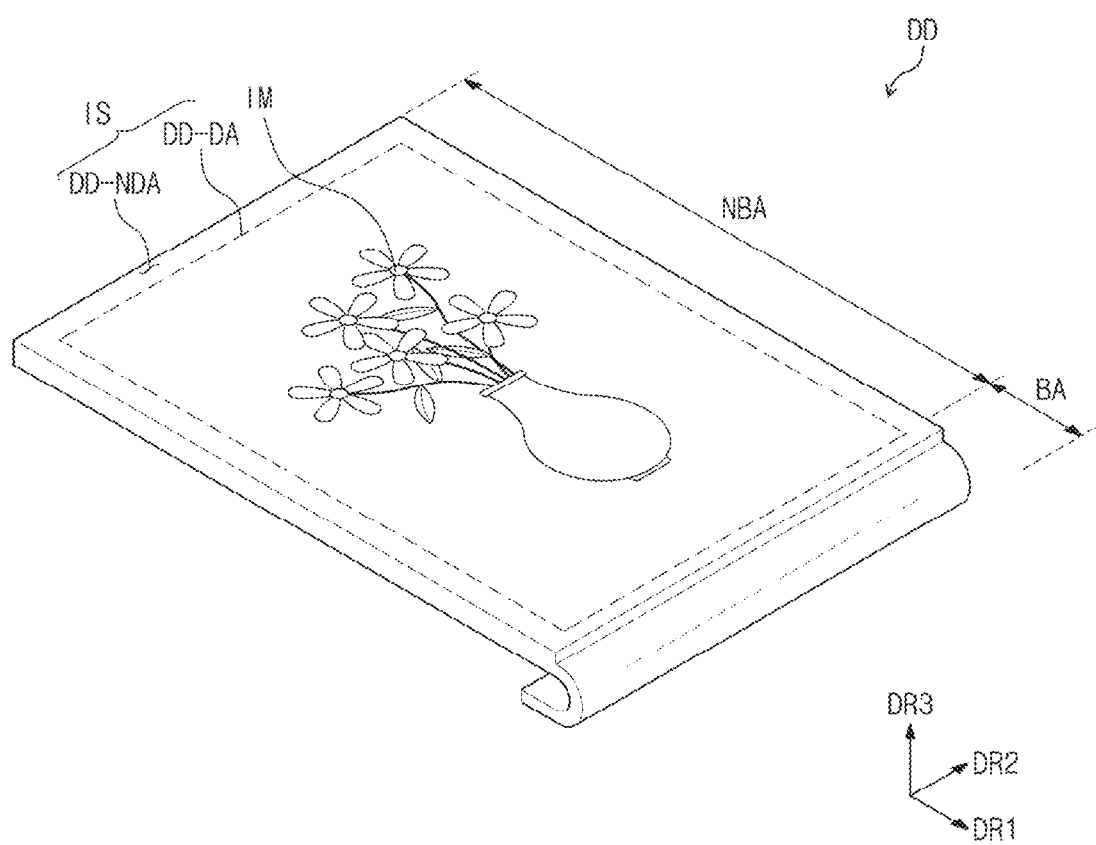
FIG. 2B is a perspective view illustrating a second operation of the display device according to an embodiment of the inventive concept.

FIGS. 1A to 1C illustrate a foldable display device as an example of the flexible display device DD. FIGS. 2A 2B illustrate a foldable display device as an example of the flexible display device DD. Alternatively, the display device DD may be a rollable flexible display device, but be not specifically limited. The flexible display device DD according to an embodiment of the inventive concept may be used for large-sized electronic devices such as televisions and monitors and small and middle-sized electronic devices such as mobile phones, tablet PC, navigation units for vehicles, game consoles, and smart watches.

As illustrated in FIG. 1A, the display surface IS of the flexible display device DD may include a plurality of areas. The flexible display device DD include a display area DD-DA on which the image IM is displayed and a non-display area DD-NDA that is adjacent to the display area DD-DA. The non-display area DD-NDA may be an area on which an image is not displayed. FIG. 1A illustrates a flower vase as an example of the image IM. For example, the display area DD-DA may have a rectangular shape. The non-display area DD-NDA may surround the display area DD-DA. However, the embodiment of the inventive concept is not limited thereto. For example, the display area DD-DA and the non-display area DD-NDA may be relatively designed in shape.

The flexible display device DD may include a housing HS. The housing HS may be disposed outside the flexible display device DD to accommodate inner components. Hereinafter, for convenience of description, the housing HS may be separately illustrated or not be described.

As illustrated in FIGS. 1A to 1C, the display device DD may include a plurality of areas defined according to the forms of operations. The display device DD may include a bending area BA that is bent on a bending axis BX, a first non-bending area NBA1 that is not bent, and a second non-bending area NBA2 that is not bent. As illustrated in FIG. 1B, the display device DD may be bent inward to allow the display surface IS of the first non-bending area NBA1 and the display surface IS of the second non-bending area NBA2 to face each other. As illustrated in FIG. 1C, the display device DD may be bent outward to allow the display surface IS to be exposed to outside.

In an embodiment of the inventive concept, the display device DD may include a plurality of bending areas BA. In addition, the bending areas BA may be formed to corresponding to user's operation for manipulating the display device DD. For example, the bending areas BA may be formed in parallel to the first directional axis DR1 or formed in a diagonal direction, unlike FIGS. 1B and 1C. The bending area BA may have a variable surface area that is determined according to a curvature radius thereof. In an embodiment of the inventive concept, the display device DD may have a shape in which only an operation mode of FIGS. 1A and 1B is repeated.

FIG. 2A is a perspective view illustrating a first operation of a display device according to an embodiment of the inventive concept. FIG. 2B is a perspective view illustrating a second operation of the display device according to an embodiment of the inventive concept. FIGS. 2A and 2B illustrate a display device in which the non-display area DD-NDA is folded as an example of the foldable display device DD. As described above, the display device DD according to an embodiment of the inventive concept is not limited to the number of bending areas BA and non-bending area NBA, and a position of the bending area.

Figure 3:
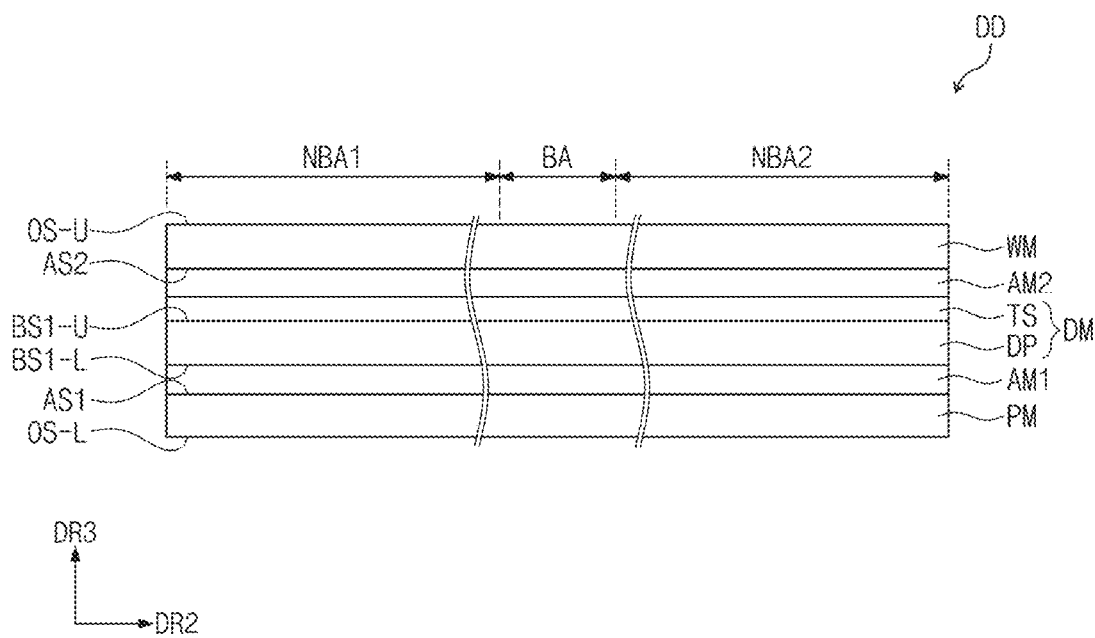
FIG. 3 is a cross-sectional view of the display device according to an embodiment of the inventive concept.
Figure 4:
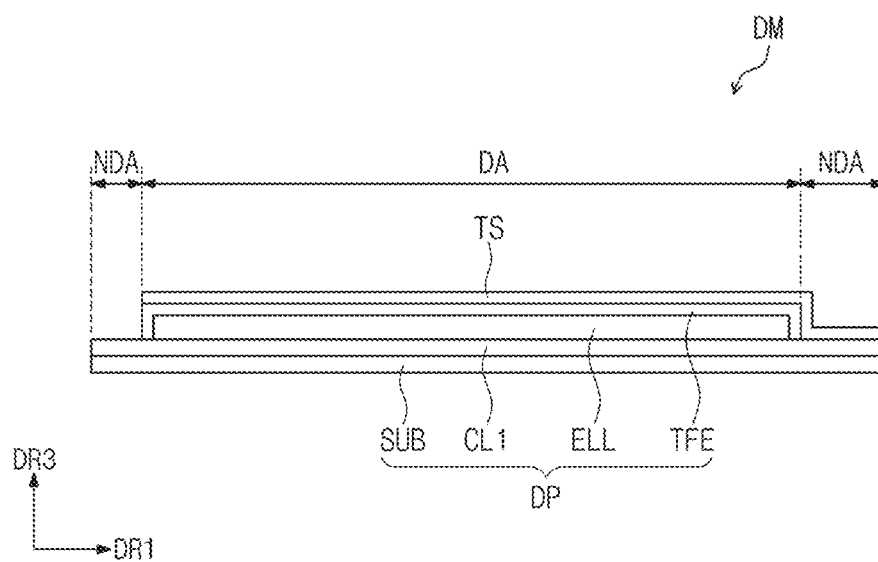
FIG. 4 is a cross-sectional view of a display module according to an embodiment of the inventive concept.

FIG. 3 is a cross-sectional view of the display device DD according to an embodiment of the inventive concept. FIG. 4 is a cross-sectional view of a display module DM according to an embodiment of the inventive concept. FIG. 3 illustrates a cross-sectional view defined by the second directional axis DR2 and the third directional axis DR3, and FIG. 4 illustrates a cross-sectional view defined by the first directional axis DR1 and the third directional axis DR3.

As illustrated in FIG. 3, the display device DD includes a protection film PM, a window WM, a display module DM, a first adhesion member AM1, and a second adhesion member AM2. The display module DM is disposed between the protection film PM and the window WM. The first adhesion member AM1 is coupled to the display module DM and the protection film PM, and the second adhesion member AM2 is coupled to the display module DM and the window WM. In an embodiment of the inventive concept, the first adhesion member AM1 and the second adhesion member AM2 may be omitted. The protection film PM and the window WM may be continuously manufactured through a coating process.

The protection film PM protects the display module DM. The protection film PM provides a first outer surface OS-L that is exposed to the outside and an adhesion surface AS1 that adheres to the first adhesion member AM1. The protection film PM prevents external moisture from being permeated into the display member DM and absorbs an external impact.

The protection film PM may include a plastic film. The protection film PM may include one selected from the group consisting of polyethersulphone (PES), polyacrylate (PAR), polyetherimide (PEI), polyethyelenen naphthalate (PEN), polyethyeleneterepthalate (PET), polyphenylene sulfide (PPS), polyallylate, polyimide (PI), polycarbonate (PC), poly(aryleneether sulfone), and a combination thereof.

A material for forming the protection film PM is not limited to plastic resins. For example, the protection film PM may include an organic/inorganic composite material. The protection film PM may include a porous organic layer and an inorganic material that is filled into pores of the porous organic layer. The protection film PM may further include a functional layer disposed on a plastic film. The functional layer may include a resin layer. The functional layer may be formed through a coating process.

The window WM protects the display module DM against the external impact and provides an input surface to a user. The window WM provides a second outer surface OS-U that is exposed to the outside and an adhesion surface AS2 that adheres to the second adhesion member AM2. The display surface IS of FIGS. 1A to 1C may be the second outer surface OS-U.

In the display device DD of FIGS. 2A and 2B, the window WM may not be disposed on the bending area BA. However, the embodiment of the inventive concept is not limited thereto. For example, in another embodiment of the inventive concept, the window WM may also be disposed on the bending area BA.

The display module DM includes an organic light emitting display panel DP and a touch sensing unit TS, which are integrally formed through a continuous process. The organic light emitting display panel DP generates the image (see reference symbol IM of FIG. 1A) corresponding to inputted image data. The organic light emitting display panel DP provides a first display panel surface BS1-L and a second display panel surface BS1-U, which face each other in the thickness direction DR3.

The touch sensing unit TS acquires coordinate information of an external input. The touch sensing unit TS may be directly disposed on the second display panel surface BS1-U. In the current embodiment, the touch sensing unit TS may be manufactured together with the organic light emitting display panel DP through the continuous process.

Although not separately shown, the display module DM according to an embodiment of the inventive concept may further include an antireflection layer. The antireflection layer may include a color filer, a laminated structure of a conductive layer/a dielectric layer/a conductive layer, or an optical member. The antireflection layer may absorb, destructively interfere with, or polarize light incident from the outside to reduce reflectance of external light.

Each of the first adhesion member AM1 and the second adhesion member AM2 may be an optically clear adhesive film (OCA), an optically clear resin (OCR), or a pressure sensitive adhesive film (PSA). Each of the first adhesion member AM1 and the second adhesion member AM2 may include a photocurable adhesion material or a heat-curable adhesion material. However, the embodiment of the inventive concept is not particularly limited thereto.

Although not particularly shown, the display device DD may further include a frame structure that supports the functional layers to maintain the state illustrated in FIGS. 1A to 2B. The frame structure may include a joint structure or a hinge structure.

As illustrated in FIG. 4, the organic light emitting display panel DP includes a base layer SUB, a first circuit layer CL1 disposed on the base layer SUB, a light emitting device layer ELL, and a thin film encapsulation layer TFE. The base layer SUB may include at least one plastic film. The base layer SUB may include a plastic substrate, a glass substrate, a metal substrate, or an organic/inorganic composite substrate as a flexible substrate.

The first circuit layer CL1 may include a plurality of insulation layers, a plurality of conductive layers, and a semiconductor layer. The plurality of conductive layers of the first circuit layer CL1 may constitute signal lines or a circuit part of a pixel. The light emitting device layer ELL may include organic light emitting diodes OLEDs. The thin film encapsulation layer TFE seals the light emitting device layer ELL. The thin film encapsulation layer TEF may include at least two inorganic thin films and an organic thin film disposed between the at least two inorganic thin films. The thin film encapsulation layer TFE may protect the light emitting device ELL against foreign substances such as moisture and dust particles.

In the current embodiment of the inventive concept, the touch sensing unit TS may be a single layer type. That is, the touch sensing unit TS may include a single conductive layer. Here, the single conductive layer means that a conductive layer is not divided by the insulating layer. A laminated structure of a first metal layer/a second metal layer/a metal oxide layer may correspond to a signal conductive layer because the first metal layer and the second metal layer are not insulated by the metal oxide layer, and a laminated structure of a first meal layer/an insulation layer/a metal oxide layer may correspond to a double conductive layer.

The single conductive layer may be patterned to form a plurality of touch electrodes and a plurality of touch signal lines. That is, the sensors of the touch sensing unit TS may be disposed on the same layer. The sensors may be directly disposed on the thin film encapsulation layer TFE. Also, a portion of each of the touch signal lines may be disposed on the same layer as the sensors. A portion of each of the touch signal lines may be disposed on the circuit layer CL1. A structure of the touch sensing unit TS will be described in detail later.

Each of the touch signal lines and the sensors may include indium tin oxide (ITO), indium zinc oxide (IZO), zinc oxide (ZnO), or indium tin zinc oxide (ITZO), PEDOT, a metal nano wire, and graphene. Each of the touch signal lines and the sensors may include a metal layer, for example, molybdenum, silver, titanium, copper, aluminum, and an alloy thereof. The touch signal lines and the sensors may include the same material or materials different from each other.

The display module DM according to an embodiment of the inventive concept may include a single layer-type touch sensing member to simplify a structure thereof when compared to that of a display module DM including a multilayer-type touch sensing member. Although the display module DM is bent as illustrated in FIGS. 1B and 1C, stress generated in the touch sensing unit TS may be reduced because the touch sensing unit TS is slim.

Figure 5:
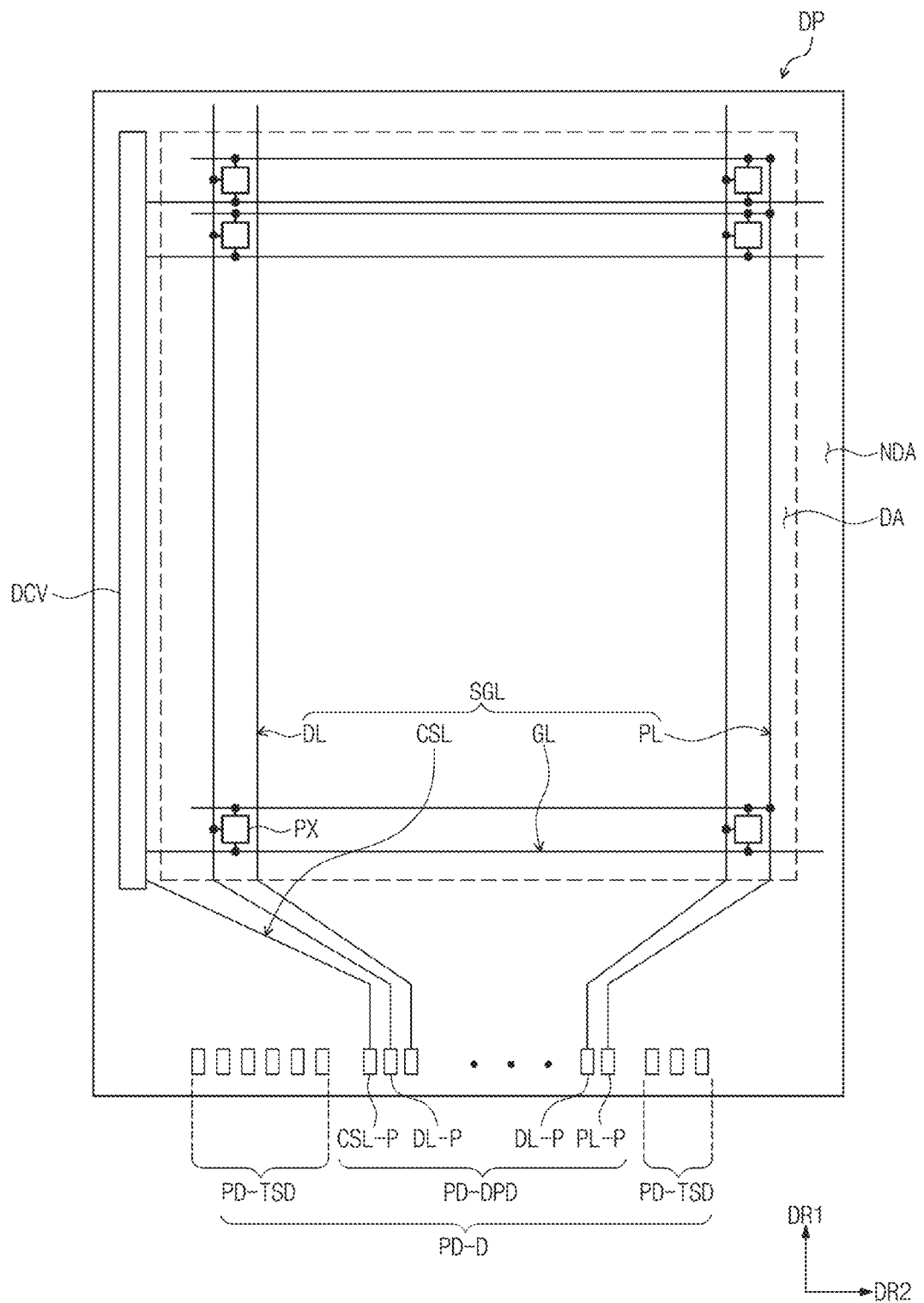
FIG. 5 is a plan view of an organic light emitting display panel according to an embodiment of the inventive concept.
Figure 6:
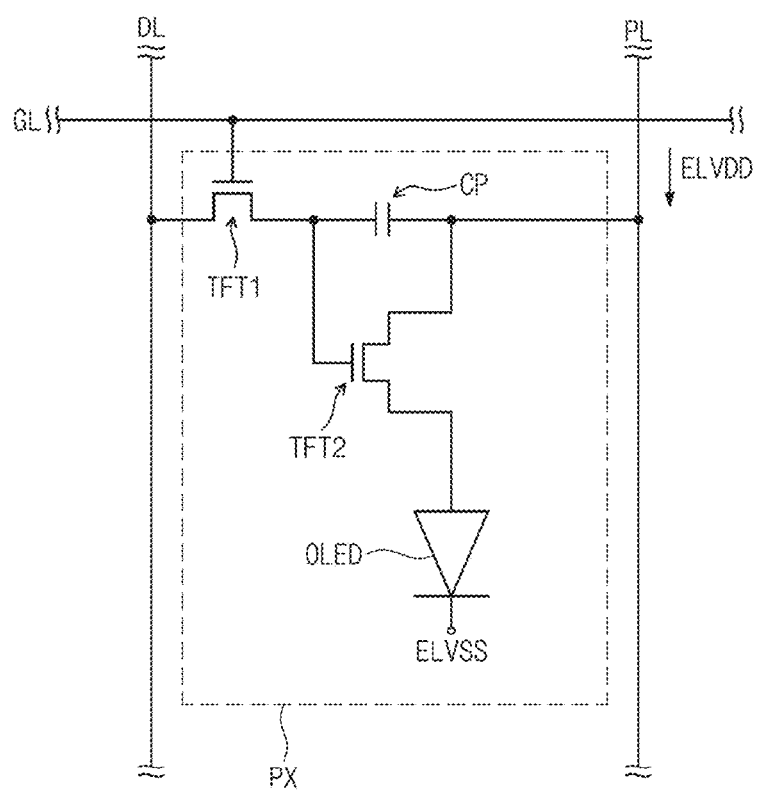
FIG. 6 is an equivalent circuit diagram of a pixel according to an embodiment of the inventive concept.
Figure 7:
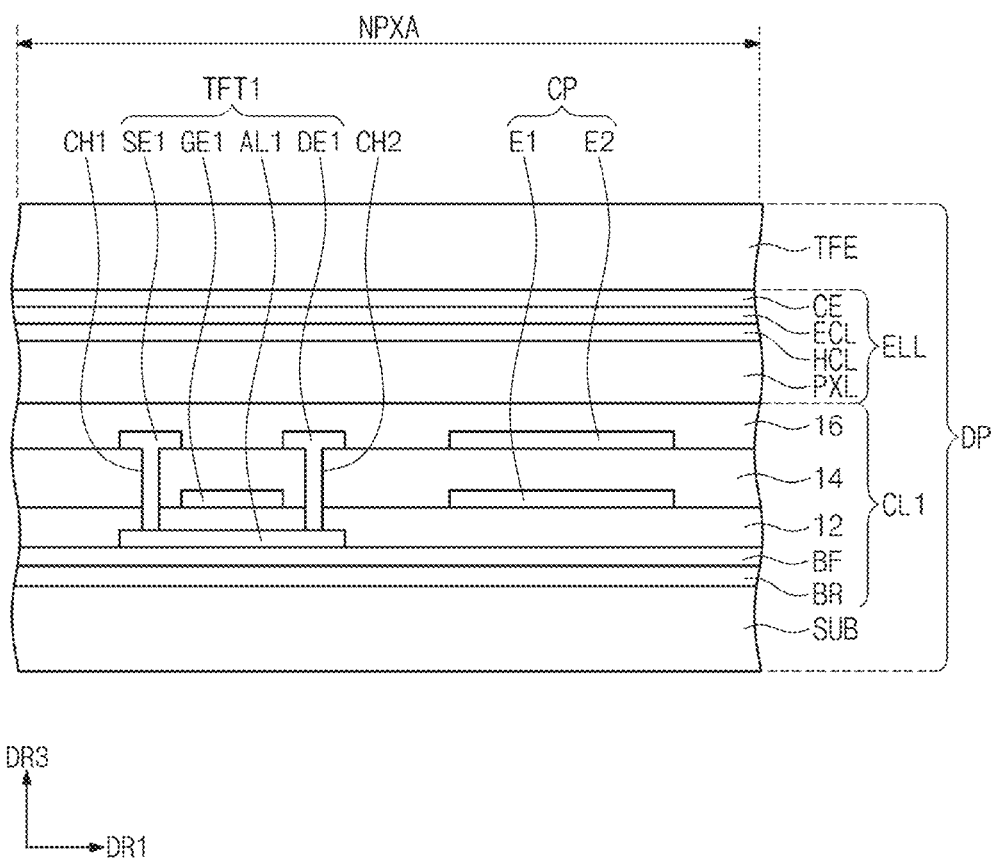
FIGS. 7 and 8 are partial cross-sectional views of the organic light emitting display panel according to an embodiment of the inventive concept.
Figure 8:
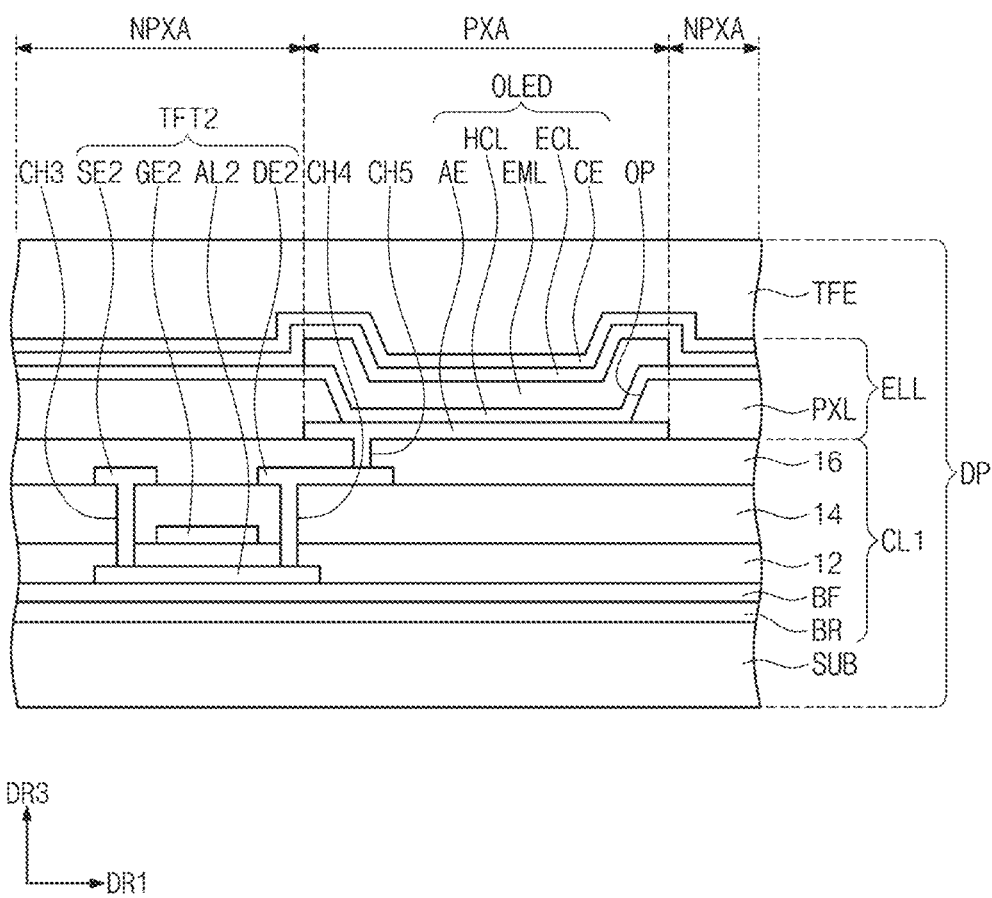

FIG. 5 is a plan view of the organic light emitting display panel DP according to an embodiment of the inventive concept. FIG. 6 is an equivalent circuit diagram of the pixel PX according to an embodiment of the inventive concept. FIGS. 7 and 8 are partial cross-sectional views of the organic light emitting display panel DP according to an embodiment of the inventive concept.

As illustrated in FIG. 5, the organic light emitting display panel DP includes a display area DA and a non-display area NDA. The display area DA and the non-display area NDA of the organic light emitting display panel DP may correspond to the display area DD-DA and the non-display area DD-NDA of the display apparatus DD, respectively. It is unnecessary that the display area DA and the non-display area NDA of the organic light emitting display panel DP respectively correspond to the display area DD-DA and the non-display area DD-NDA of the display apparatus DD. For example, the display area DA and the non-display area NDA of the organic light emitting display panel DP may be changed according to a structure/design of the organic light emitting display panel DP.

The organic light emitting display panel DP may include a plurality of signal lines SGL and a plurality of pixels PX. An area on which the plurality of pixels PX are disposed may be defined as the display area DA. In the current embodiment, the non-display area NDA may be defined along an edge of the display area DA and surrounds the display area DA.

The plurality of signal lines SGL includes gate lines GL, data lines DL, a power line PL, and a control signal line CSL. The gate lines GL are connected to corresponding pixels of the plurality of pixels PX, and the data lines DL are connected to corresponding pixels PX of the plurality of pixels PX, respectively. The power line PL is connected to the plurality of pixels PX. A gate driving circuit DCV to which the gate lines GL are connected may be disposed on one side of the non-display area NDA. The control signal line CSL may provide control signals to the gate driving circuit DCV.

Portions of the gate lines GL, the data lines DL, the power lines PL, and the control signal line CSL may be disposed on the same layer, and other portions may be disposed on layers different from each other. When the signal lines, which are disposed on one layer, of the gate lines GL, the data lines DL, the power lines PL, and the control signal line CSL are defined as a first signal line, the signal lines disposed on one different layer may be defined as a second signal line. The signal lines disposed on further another layer may be defined as a third signal line.

Each of the gate lines GL, the data lines DL, the power lines PL, and the control signal line CSL may include a signal line unit and lower pads PD-D connected to an end of the signal line unit. The signal line unit may be defined as portions except for the lower pads PD-D of each of the gate lines GL, the data lines DL, the power lines PL, and the control signal line CSL.

In an embodiment of the inventive concept, the lower pads PD-D may include a lower display panel pad PD-DPD and a lower touch sensing member pad PD-TSD. The lower pads PD-D may be formed through the same process as transistors for driving the pixels PX. For example, the transistors for driving the pixels PX and the lower pads PD-D may be formed through the same low temperature polycrystalline silicon (LTPS) process or low temperature polycrystalline oxide (LTPO) process.

In an embodiment of the inventive concept, the display panel pads PD-DP may include a control pad CSL-P, a data pad DL-P, and a power pad PL-P. Although the gate pad unit is not illustrated, the gate pad unit may overlap the gate driving circuit DCV and be connected to the gate driving circuit DCV. Although not particularly shown, a portion of the non-display area NDA on which the control pad CSL-P, the data pad DL-P, and the power pad PL-P are aligned may be defined as a pad area. As described below, the pads of the touch sensing unit TS may be disposed adjacent to the pads of the above-described organic light emitting display panel DP.

FIG. 6 illustrates an example of a pixel PX connected to one gate line GL, one data line DL, and the power line PL. However, the embodiment of the inventive concept is not limited to the configuration of the pixel PX. For example, the pixel PX may have various configurations.

The pixel PX includes an organic light emitting diode OLED as a display device. The organic light emitting diode OLED may be a top emission-type diode or a bottom emission-type diode. The pixel PX includes a first transistor TFT1 (or a switching transistor), a second transistor TFT2 (or a driving transistor), and a capacitor CP as a circuit unit for driving the organic light emitting diode OLED. The organic light emitting diode OLED generates light in response to an electrical signal provided from the transistors TFT1 and TFT2. A cathode of the organic light emitting diode OLED is connected to a second power source voltage (ELVSS).

The first transistor TFT1 outputs a data signal applied to the data line DL in response to a scanning signal applied to the gate line GL. The capacitor CP charges a voltage corresponding to the data signal received from the first transistor TFT1.

The second transistor TFT2 is connected to the organic light emitting diode OLED. The second transistor TFT2 controls driving current flowing through the organic light emitting diode OLED to correspond to a charge amount stored in the capacitor CP. The organic light emitting diode OLED emits light during a turn-on period of the second transistor TFT2.

FIG. 7 is a cross-sectional view of portions corresponding to the first transistor TFT1 and the capacitor CP of the equivalent circuit of FIG. 6. FIG. 8 is a cross-sectional view of portions corresponding to the second transistor TFT2 and the organic light emitting diode OLED of the equivalent circuit of FIG. 6.

As illustrated in FIGS. 7 and 8, the first circuit layer CL1 is disposed on the base layer SUB. A semiconductor pattern AL1 (hereinafter, referred to as a first semiconductor pattern) of the first transistor TFT1 and a semiconductor pattern AL2 (hereinafter, referred to as a second semiconductor pattern) of the second transistor TFT2 are disposed on the base layer SUB. The first and second semiconductor patterns AL1 and AL2 may be selected from amorphous silicon, polysilicon, and a metal oxide semiconductor. The first semiconductor patterns AL1 and the second semiconductor pattern AL2 may be formed of the same material. The first semiconductor patterns AL1 and the second semiconductor pattern AL2 may be formed of different materials.

The first circuit layer CL1 includes a first conductive pattern (see reference numeral CDP1 of FIG. 12) and organic/inorganic layers BR, BF, 12, 14, and 16. The first conductive pattern (see reference numeral CDP1 of FIG. 12) may include a first transistor TFT1, a second transistor TFT2, and electrodes E1 and E2. The organic/inorganic layers BR, BF, 12, 14, and 16 may include first functional layers BR and BF, a first insulation layer 12, a second insulation layer 14, and a third insulation layer 16.

The functional layers BR and BF may be disposed on one surface of the base layer SUB. The functional layers BR and BF may include at least one of a barrier layer BR or a buffer layer BF. The first and second semiconductor patterns AL1 and AL2 may be disposed on the barrier layer BR or the buffer layer BF.

The first insulation layer 12 covering the first and second semiconductor patterns AL1 and AL2 is disposed on the base layer SUB. The first insulation layer 12 includes an organic layer and/or an inorganic layer. Particularly, the first insulation layer 12 may include a plurality of inorganic thin films. The plurality of inorganic thin films may include a silicon nitride layer and a silicon oxide layer.

A control electrode GE1 (hereinafter, referred to as a first control electrode) of the first transistor TFT1 and a control electrode GE2 (hereinafter, referred to as a second control electrode) of the second transistor TFT2 are disposed on the first insulation layer 12. A first electrode E1 of the capacitor CP is disposed on the first insulation layer 12. The first control electrode GE1, the second control electrode GE2, and the first electrode E1 may be manufactured by the same photolithograph process as that of the gate lines GL (see FIG. 5). That is, the first electrode E1 may be formed of the same material as the gate lines GL, have the same laminated structure as the gate lines GL, and be disposed on the same layer as the gate lines GL.

A second insulation layer 14 covering the first and second control electrodes GE1 and GE2 and the first electrode E1 is disposed on the first insulation layer 12. The second insulation layer 14 includes an organic layer and/or an inorganic layer. Particularly, the second insulation layer 14 may include a plurality of inorganic thin films. The plurality of inorganic thin films may include a silicon nitride layer and a silicon oxide layer.

The data lines DL (see FIG. 3A) may be disposed on the second insulation layer 14. An input electrode SE1 (hereinafter, referred to as a first input electrode) and an output electrode DE1 (hereinafter, referred to as a first output electrode) of the first transistor TFT1 are disposed on the second insulation layer 14. An input electrode SE2 (hereinafter, referred to as a second input electrode) and an output electrode DE2 (hereinafter, referred to as a second output electrode) of the second transistor TFT2 are disposed on the second insulation layer 14. The first input electrode SE1 is branched from a corresponding data line of the data lines DL. The power line PL (see FIG. 5) may be disposed on the same layer as the data lines DL. The second input electrode SE2 may be branched from the power line PL.

A second electrode E2 of the capacitor CP is disposed on the second insulation layer 14. The second electrode E2 may be manufactured by the same photolithograph process as that of each of the data line DL and the power line PL. Also, the second electrode E2 may be formed of the same material, have the same structure, and be disposed on the same layer as that of each of the data line DL and the power line PL.

The first input electrode SE1 and the first output electrode DE1 are connected to the first semiconductor pattern AL1 through first and second through holes CH1 and CH2, which pass through the first and second insulation layers 12 and 14, respectively. The first output electrode DE1 may be electrically connected to the first electrode E1. For example, the first output electrode DE1 may be connected to the first electrode E1 through a through hole (not shown) passing through the second insulation layer 14. The second input electrode SE2 and the second output electrode DE2 are connected to the second semiconductor pattern AL2 through third and fourth through holes CH3 and CH4, which pass through the first and second insulation layers 12 and 14, respectively. According to another embodiment of the inventive concept, each of the first and second transistors TFT1 and TFT2 may have a bottom gate structure.

A third insulation layer 16 covering the first input electrode SE1, the first output electrode DE1, the second input electrode SE2, and the second output electrode DE2 is disposed on the second insulation layer 14. The third insulation layer 16 includes an organic layer and/or an inorganic layer. Particularly, the third insulation layer 16 may include an organic material to provide a flat surface.

One of the first, second, and third insulation layers 12, 14, and 16 may be omitted according to the circuit structure of the pixel. Each of the second and third insulation layers 14 and 16 may be defined as an interlayer dielectric layer. The interlayer dielectric layer may be disposed between a lower conductive pattern, which is disposed under the interlayer dielectric layer, and an upper conductive pattern, which is disposed above the interlayer dielectric layer, to insulate the conductive patterns from each other.

The first circuit layer CL1 includes dummy conductive patterns. The dummy conductive patterns are disposed on the same layer as the semiconductor patterns AL1 and AL2, the control electrodes GE1 and GE2, or the output electrodes DE1 and DE2. The dummy conductive patterns may be disposed on the non-display area NDA (see FIG. 5). The dummy conductive patterns will be described later in detail.

The light emitting device layer ELL is disposed on the third insulation layer 16. A pixel defining layer PXL and the organic light emitting diode OLED are disposed on the third insulation layer 16. An anode AE is disposed on the third insulation layer 16. The anode AE is connected to the second output electrode DE2 through a fifth through hole CH5 passing through the third insulation layer 16. An opening OP is defined in the pixel defining layer PXL. The opening OP of the pixel defining layer PXL exposes at least a portion of the anode AE.

The light emitting device layer ELL may include an emission area PXA and a non-emission area NPXA that is adjacent to the emission area PXA. The non-emission area NPXA may surround the emission area PXA. In the current embodiment, the emission area PXA is defined to correspond to the anode AE. However, the embodiment of the inventive concept is not limited to the above-described emission area PXA. That is, if light is emitted from an area, the area may be defined as the emission area PXA. The emission area PXA may be defined to correspond to a portion of the anode AE, which is exposed by the opening OP.

A hole control layer HCL may be commonly disposed on the emission area PXA and the non-emission area NPXA. Although not particularly shown, a common layer such as the hole control layer HCL may be commonly disposed on the plurality of pixels PX (see FIG. 5).

An organic light emitting layer EML is disposed on the hole control layer HCL. The organic light emitting layer EML may be disposed to cover the opening OP. The organic light emitting layer EML adjacent to each other are electrically separated from each other.

An electronic control layer ECL is disposed on the organic light emitting layer EML. A cathode CE is disposed on the electronic control layer ECL. The cathode CE is commonly disposed on the plurality of pixels PX.

Although the patterned organic light emitting layer EML is illustrated as an example in the current embodiment, the organic light emitting layer EML may be commonly disposed on the plurality of pixels PX. Here, the organic light emitting layer EML may emit white light. Also, the organic light emitting layer EML may have a multilayer structure.

In the current embodiment, the thin film encapsulation layer TFE directly covers the cathode CE. In the current embodiment, a capping layer covering the cathode CE may be further disposed. Here, the thin film encapsulation layer TFE directly covers the capping layer. The thin film encapsulation layer TFE may include an organic layer including an organic material and an inorganic layer including an inorganic material.

Figure 9:
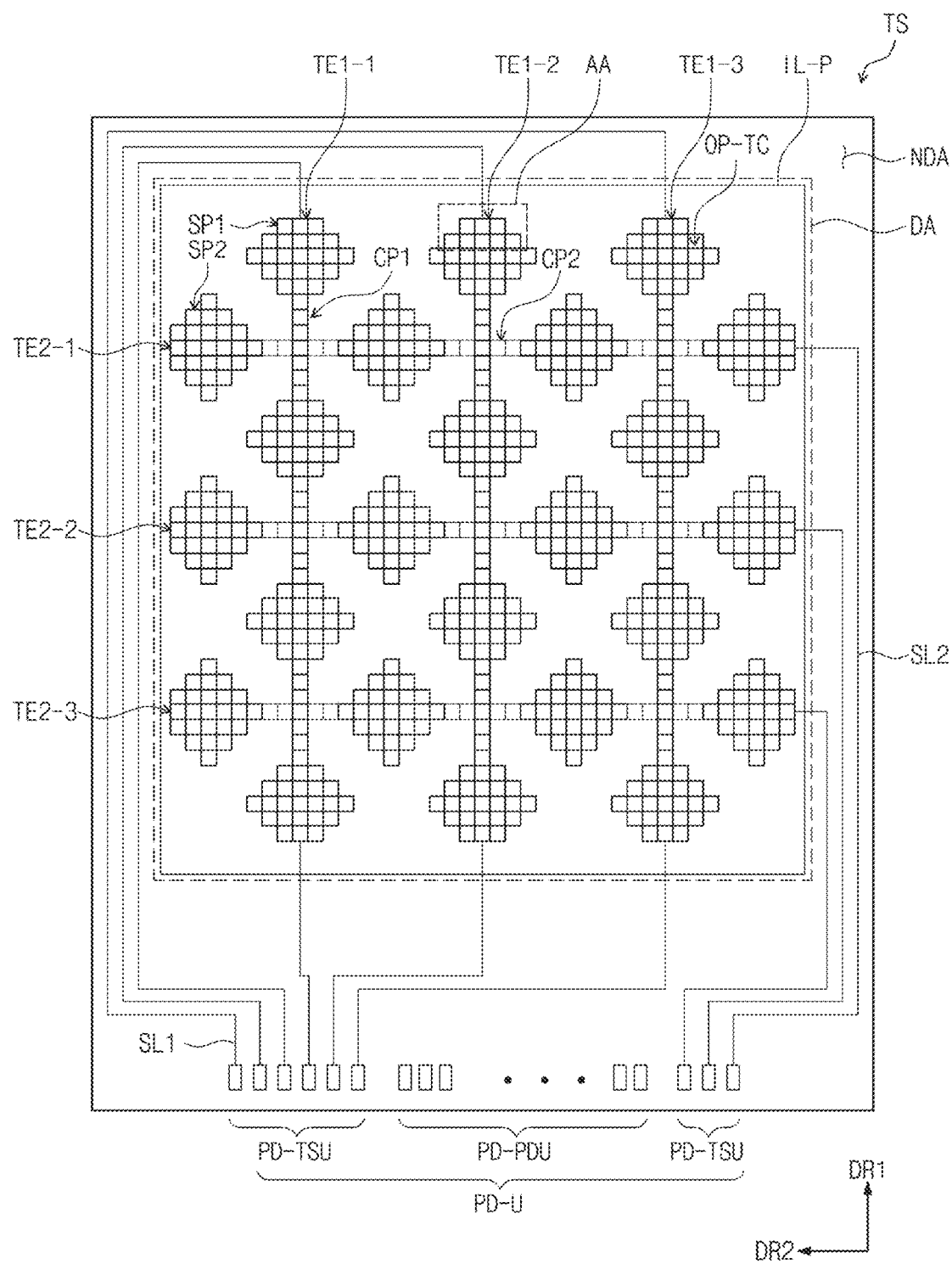
FIG. 9 is a plan view of a touch sensing member according to an embodiment of the inventive concept.

FIG. 9 is a plan view of the touch sensing unit TS according to an embodiment of the inventive concept.

In the current embodiment, a 1-layered capacitive touch sensing member TS is illustrated as an example. The 1-layered capacitive touch sensing member TS may be driven in a self-capacitance manner or a mutual capacitance manner. However, an embodiment of the inventive concept is not limited to the driving manner for acquiring the coordinate information. Also, the touch sensing member TS may not be limited to the 1-layered structure. For example, the touch sensing member TS may have a 2-layered structure.

The touch sensing member TS may include first touch patterns TE1-1 to TE-3, first touch signal lines SL1, second touch patterns TE2-1 to TE2-2, second touch signal lines SL2, and touch sensing member pad upper pads PD-U.

The first touch patterns TE1-1 to TE1-3 extend in the first direction DR1 and are arranged in the second direction DR2. Each of the first touch patterns TE1-1 to TE1-3 may have a mesh shape in which a plurality of touch openings OP-TC are defined.

Each of the first touch patterns TE1-1 to TE1-3 includes a plurality of first sensing patterns SP1 and a plurality of first connection patterns CP1. The first sensing patterns SP1 are arranged in the first direction DR1. Each of the first connection patterns connects two adjacent first sensing patterns SP1 arranged along a first direction DR1.

Each of the first touch signal lines SL1 may be connected to one end of the first touch patterns TE1-1 to TE1-3 and connected to pads in the pad area. The first touch signal lines SL may have the same layered structure as the first touch patterns TE1-1 to TE1-3.

The second touch patterns TE2-1 and TE2-3 are insulated from the first touch patterns TE1-1 to TE1-3 and cross the first touch patterns TE1-1 to TE1-3. The second touch patterns TE2-1 and TE2-3 are insulated from the first touch patterns TE1-1 to TE1-3 by insulation patterns IL-P. The insulation patterns IL-P may include an inorganic or organic material. The inorganic material may include silicon oxide or silicon nitride. The organic material may include at least one of an acrylic-based resin, a methacrylic-based resin, a polyisoprene-based resin, a vinyl-based resin, an epoxy-based resin, a urethane-based resin, a cellulose-based resin, or a perylene-based resin.

Each of the second touch patterns TE2-1 to TE2-3 may have a mesh shape in which a plurality of touch openings OP-TC are defined.

Each of the second touch patterns TE2-1 to TE2-3 includes a plurality of second sensing patterns SP2 and a plurality of second connection patterns CP2. The second sensing patterns SP2 are arranged in the second direction DR.2. Each of the second connection patterns CP2 connects two adjacent second sensing patterns SP2 arranged along the second direction DR2.

Each of the second connection patterns CP2 may have a bridge function. The insulation patterns IL-P are disposed on the first connection patterns CP1, and the second connection patterns CP2 are disposed on the insulation patterns IL-P.

Each of the second touch signal lines SL2-1 or SL2-3 may also be connected to one end of the second touch patterns TE2-1 to TE2-3 and connected to pads in the pad area. The second touch signal lines SL2-1 to SL2-3 may have the same layered structure as the second touch patterns TE2-1 to TE2-3.

The first touch patterns TE1-1 to TE1-3 and the second touch patterns TE2-1 and TE2-3 are capacitively coupled to each other. Since touch sensing signals are applied to the first touch patterns TE1-1 to TE1-3, capacitors are disposed between the first sensing patterns SP1 and the second sensing patterns SP2.

The shapes of the first touch patterns TE1-1 to TE1-3 and the second touch patterns TE2-1 to TE2-3 may be merely examples, and thus, the embodiment of the inventive concept is not limited thereto. For example, the connection patterns CP1 and CP2 may be defined as portions at which the first touch patterns TE1-1 to TE1-3 and the second touch patterns TE2-1 to TE2-3 cross each other, and the sensing patterns SP1 and SP2 may be defined as portions at which the first touch patterns TE1-1 to TE1-3 and the second touch patterns TE2-1 to TE2-3 do not overlap each other. For example, each of the first touch patterns TE1-1 to TE1-3 and the second touch patterns TE2-1 to TE2-3 may have a bar shape having a predetermined width.

The touch sensing member pad upper pads PD-U may be disposed on distal ends of the first and second touch signal lines SL1 and SL2. The touch sensing member pad upper pads PD-U may include an upper display panel pad PD-PDU and an upper touch sensing member pad PD-TSU. The upper pads PD-U may be formed through the same process as the first touch patterns TE1-1 to TE-3, the first touch signal lines SL1, the second touch patterns TE2-1 to TE2-2, and second touch signal lines SL2.

Figure 10:
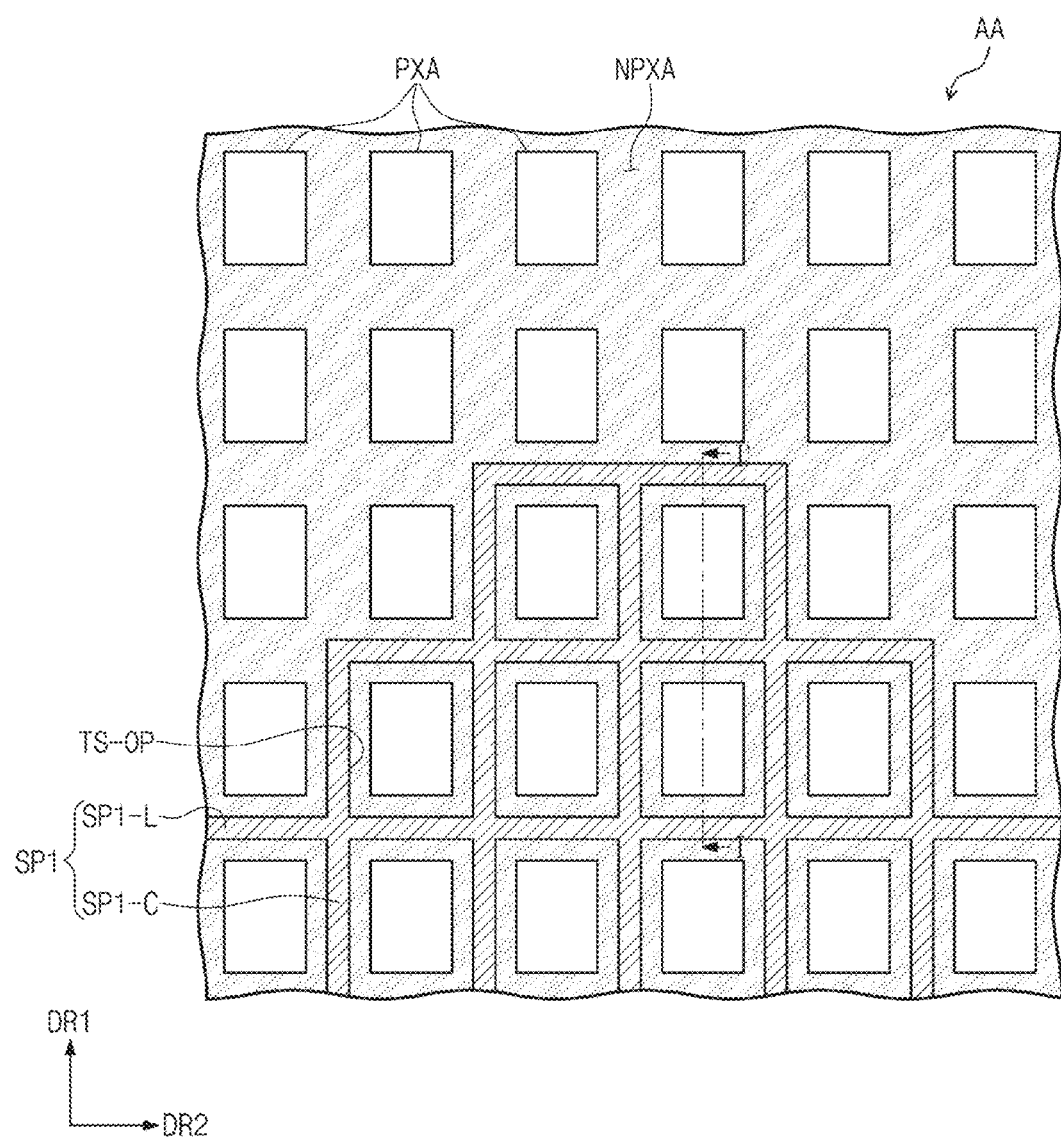
FIG. 10 is an enlarged view of a portion AA of FIG. 9.
Figure 11:
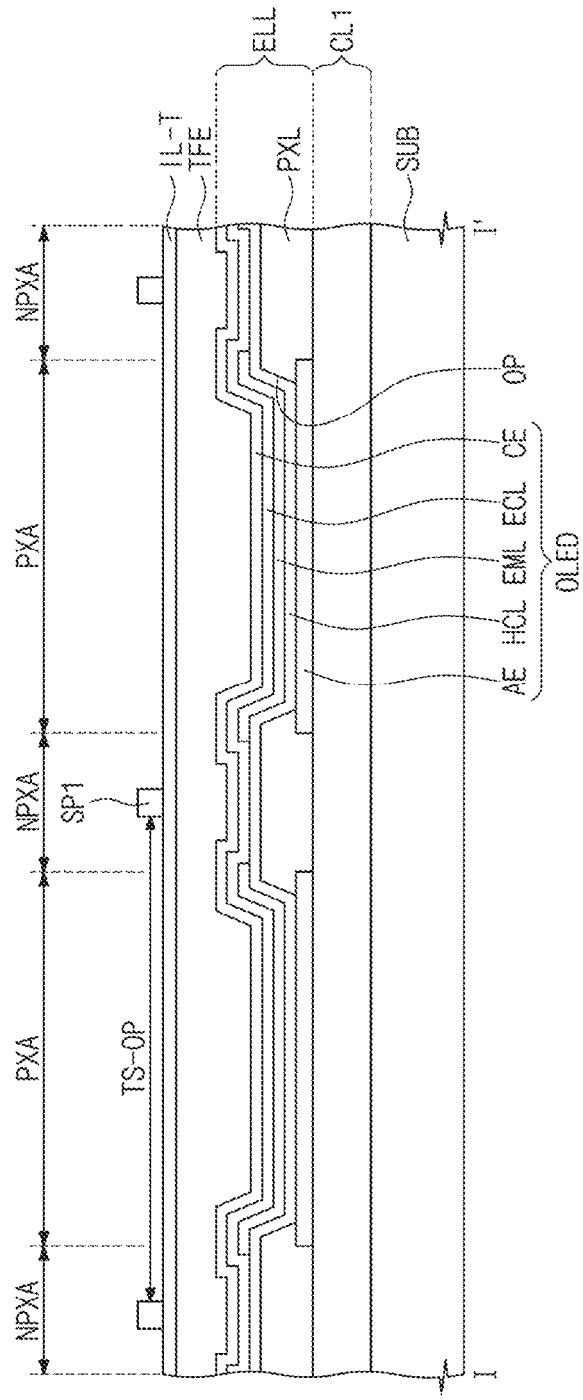
FIG. 11 is a cross-sectional view taken along line I-I' of FIG. 10.

FIG. 10 is an enlarged view of a portion AA of FIG. 9. FIG. 11 is a cross-sectional view taken along line I-I' of FIG. 10.

The display area DA includes a plurality of emission areas PXA and a non-emission area NPXA surrounding the plurality of emission areas PXA. The first sensing patterns SP1 may have a mash shape that overlaps the non-emission area NPXA. Although not particularly shown, the second sensing patterns SP2 and the touch signal lines SL1 and SL2 may also have the mesh shape that overlaps the non-emission area NPXA.

The sensing patterns SP1 includes a plurality of vertical portions SP1-C extending in the first direction DR1 and a plurality of horizontal portions SP1-L extending in the second direction DR2. The plurality of vertical portions SP1-C and the plurality of horizontal portions SP1-L may be defined as a mesh line. The mesh line may have a line width of several micrometers.

The plurality of vertical portions SP1-C and the plurality of horizontal portions SP1-L may be connected to each other to define a plurality of openings TS-OP. Although a structure in which the touch openings TS-OP one-to-one correspond to the light emitting areas PXA is illustrated, the embodiment of the inventive concept is not limited thereto. One touch opening TS-OP may correspond to two or more light emitting areas PXA. Although the mesh line exposed to the outside is illustrated in FIGS. 10 and 11, the display module DM (see FIG. 4) may further include an insulation layer disposed on the thin film encapsulation layer TFE to cover the mesh line.

Figure 12:
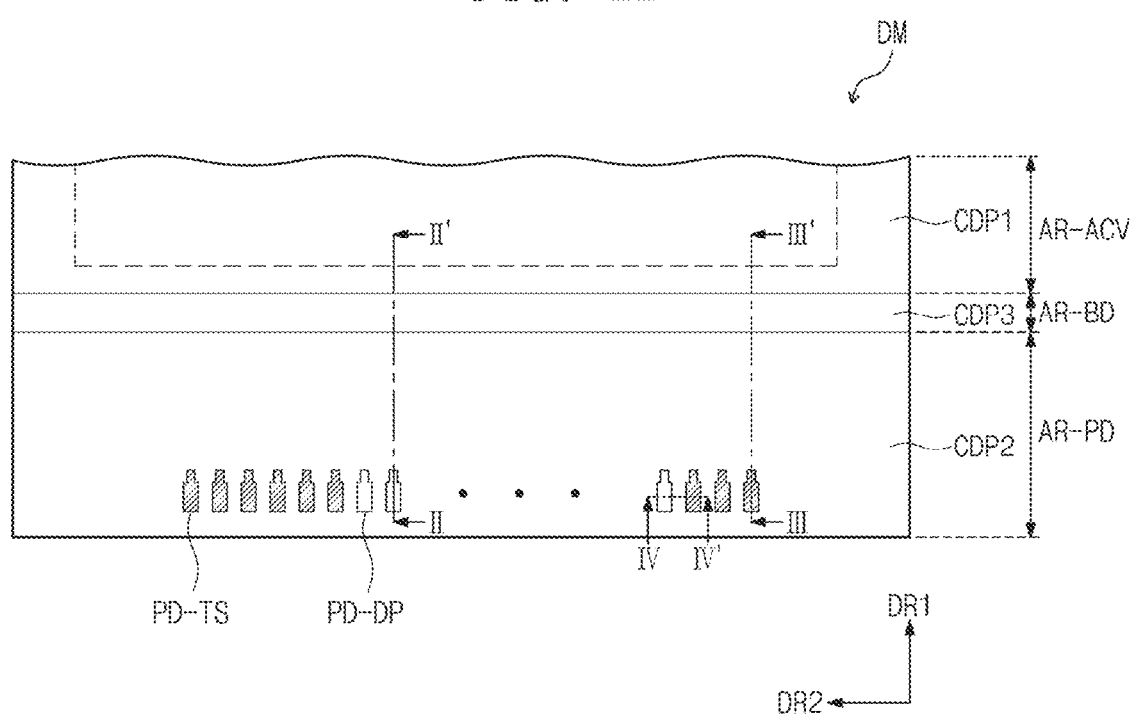
FIG. 12 is a view of display panel pads of FIG. 5 and touch sensing member pads of FIG. 9.

FIG. 12 is a view of the display panel pads PD-DP of FIG. 5 and the touch sensing member pads PD-TS of FIG. 9. The display module DM may include an active area AR-ACV, a pad area AR-PD, and a boundary area AR-BD disposed between the active area AR-CV and the pad area AR-PD.

In the active area AR-ACV, the display module DM includes a first conductive pattern CDP1. In the pad area AR-PD, the display module DM includes a second conductive pattern CDP2. In the boundary area AR-BD, the display module DM includes a third conductive pattern CDP3. Each of the first to third conductive patterns CDP1 to CDP3 may include a metal as a pattern for conducting an electrical signal for driving the display panel DP or the touch sensing member TS.

The display panel pads PD-DP and the touch sensing member pads PD-TS may be disposed adjacent to each other. Also, the display panel pads PD-DP and the touch sensing member pads PD-TS may be disposed parallel to each other. However, the embodiment of the inventive concept is not limited thereto. For example, the display panel pads PD-DP and the touch sensing member pads PD-TS may be spaced apart from each other as necessary, but be not disposed parallel to each other.

Figure 13A:
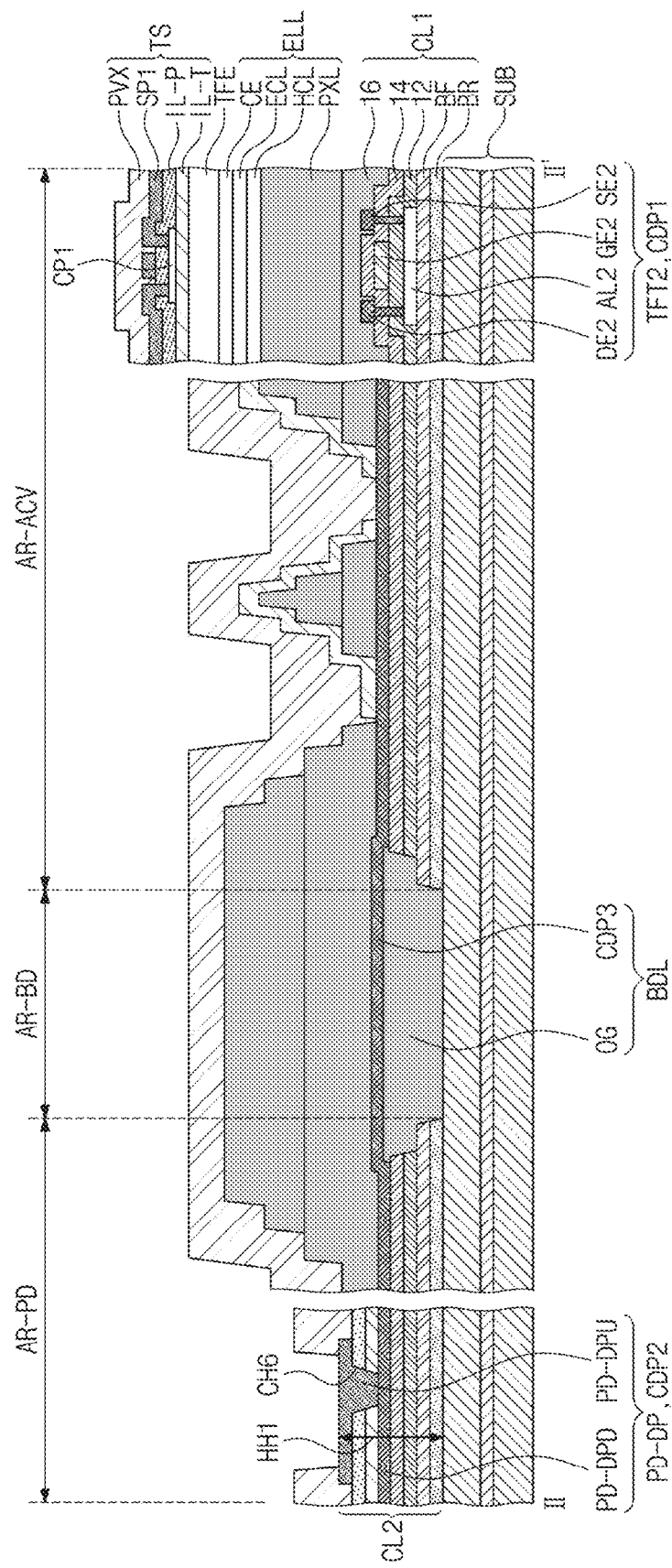
FIG. 13A is a cross-sectional view taken along line II-II' of FIG. 12.
Figure 13B:
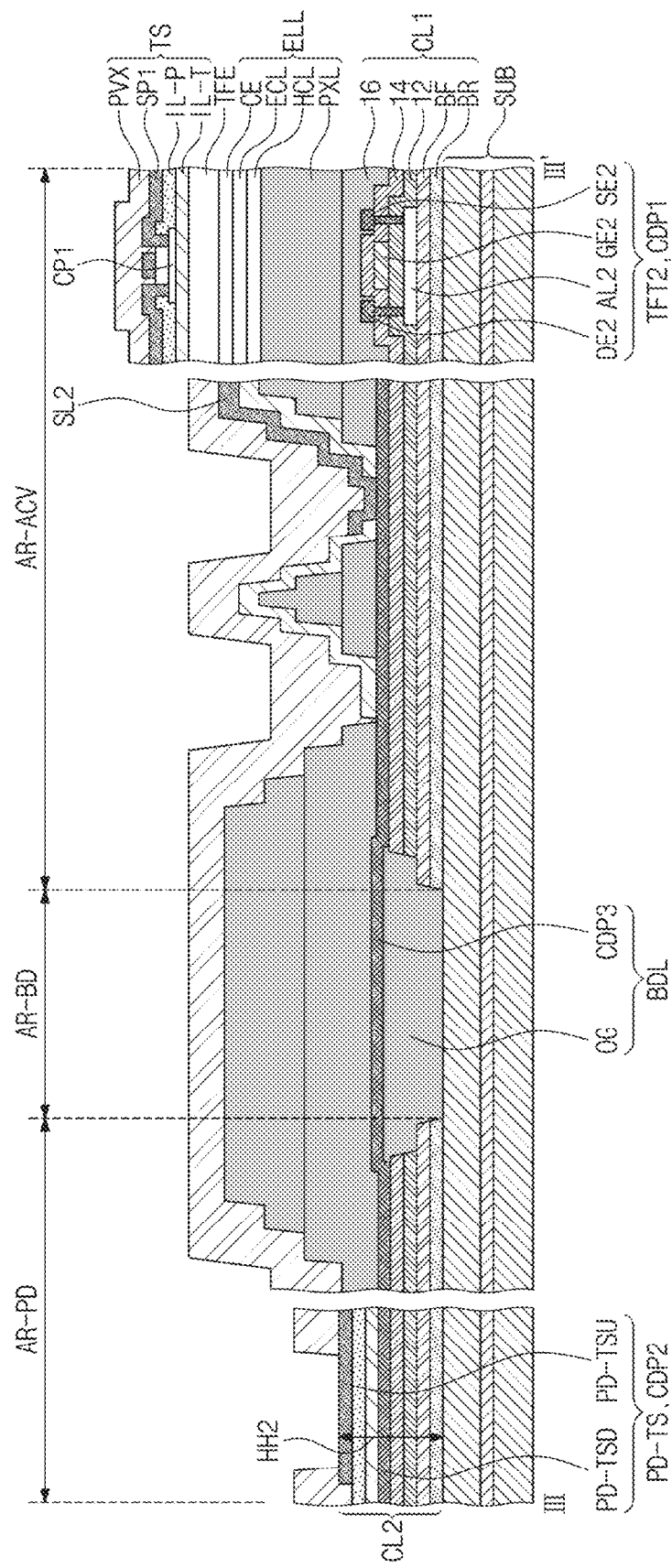
FIG. 13B is a cross-sectional view taken along line III'-III' of FIG. 12.
Figure 13C:
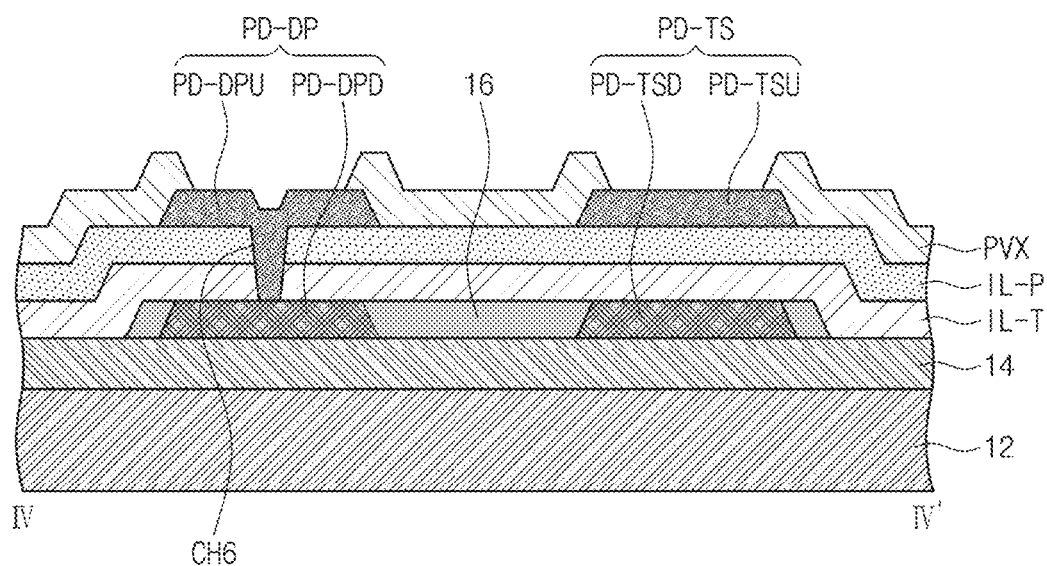
FIG. 13C is a cross-sectional view taken along line IV-IV' of FIG. 12.

FIG. 13A is a cross-sectional view taken along line II-II' of FIG. 12. FIG. 13B is a cross-sectional view taken along line III-III' of FIG. 12. FIG. 13C is a cross-sectional view taken along line IV-IV' of FIG. 12. FIGS. 13A to 13C illustrate an embodiment of the inventive concept.

Referring to FIG. 13A that illustrates the touch sensing member pad, the base layer SUB includes an active area AR-ACV, a pad area AR-PD, and a boundary area AR-BD between the active area AR-CV and the pad area AR-PD.

In the active area AR-ACV, the pad area AR-PD, and the boundary area AR-BD according to an embodiment of the inventive concept, the active area AR-ACV may be an area including the light emitting device layer ELL, the pad area AR-PD may be an area including the display panel pads PD-DP and the touch sensing member pads PD-TS to which a signal is applied from the printed circuit board, and the boundary area AR-BD may be an area between the active area AR-ACV and the pad area AR-PD.

The circuit layers CL1 and CL2 are disposed on the base layer SUB. The circuit layer CL1 and CL2 includes a first circuit layer CL1 and a second circuit layer CL2. The first circuit layer CL1 is disposed on the active area AR-ACV of the base layer SUB. The second circuit layer CL2 is disposed on the pad area AR-PD of the base layer SUB.

The light emitting layer ELL and the thin film encapsulation layer TFE are disposed on the first circuit layer CL1. The first and second circuit layers CL1 and CL2 may include functional layers BR and BF, respectively. For convenience, in the functional layers BR and BF, the function layer of the first circuit layer CL1 may be referred to as a first functional layer, and the functional layer of the second circuit layer CL2 may be referred to as a second functional layer.

Because the first circuit layer CL1, the light emitting device layer ELL, and the thin film encapsulation layer TFE are illustrated in FIGS. 7 and 8, their detailed descriptions will be omitted.

The touch sensing member TS may be disposed on the thin film encapsulation layer TFE. The touch sensing member TS includes a touch inorganic layer IL-T, an insulation pattern IL-P, a plurality of touch electrodes, and a touch protection layer PVX on a cross-section. Each of the touch inorganic layer IL-T and the insulation pattern IL-P may include an inorganic material. The touch protection layer PVX may include an organic material.

Referring to FIG. 9, the plurality of touch electrodes may form first touch patterns TE1-1 to TE1-3, first touch signal lines SL1, second touch patterns TE2-1 to TE2-2, and second touch signal lines SL2.

The second circuit layer CL2 may include a second conductive pattern CDP2 (see FIG. 12) and organic/inorganic layers BR, BF, 12, 14, and 16. The second conductive pattern CDP2 may include a display panel pad PD-DP and a touch sensing member pad PD-TS. The organic/inorganic layers BR, BF, 12, 14, and 16 may include second functional layers BR and BF, a first insulation layer 12, a second insulation layer 14, and a third insulation layer 16.

The display panel pad PD-DP may be disposed on the second functional layer and be electrically connected to the first circuit layer CL1. At least one of the first and second insulation layers 12 and 14 may be disposed between the display panel pad PD-DP and the second functional layer.

The display panel pad PD-DP may include a lower display panel pad PD-DPD and an upper display panel pad PD-DPU. The lower display panel pad PD-DPD is electrically connected to the first conductive pattern CDP1 through the third conductive pattern CDP3. The upper display panel pad PD-DPU is disposed on the lower display panel pad PD-DPD and is electrically connected to the lower display panel pad PD-DPD. Thus, an electrical signal applied to the upper display panel pad PD-DPU is applied to the first conductive pattern CDP1 of the first circuit layer CL1 via the lower display panel pad PD-DPD.

A boundary layer BDL is disposed on the boundary area AR-BD of the base layer SUB. The boundary layer BDL may include an organic layer OG and a third conductive pattern CDP3. The organic layer OG may contact a top surface of the base layer SUB and be disposed between the first and second circuit layers CL1 and CL2. More particularly, the organic layer OG may be disposed between the first and second functional layers.

The boundary layer BDL may not include an inorganic layer including an inorganic material, unlike the first and second circuit layers CL1 and CL2. Thus, the boundary layer BDL may be improved in flexibility, and a portion of the display panel DP, which overlaps the boundary area AR-BD, may be easily bent.

An organic layer may be further disposed on the third conductive pattern CDP3. The organic layer disposed on the third conductive pattern CDP3 may be formed through the same process as the third insulation layer 16 or the pixel defining layer PXL.

The third conductive pattern CDP3 may be formed through the same process as the lower display panel pad PD-DPD. However, the embodiment of the inventive concept is not limited thereto. For example, the third conductive pattern CDP3 may be formed through a separate process to contact the lower display panel pad PD-DPD and then be electrically connected to the lower display panel pad PD-DPD.

Referring to FIG. 13B, the touch signal line SL2 of the touch sensing member TS is electrically connected to the third conductive pattern CDP3 on the active area AR-ACV. The third conductive pattern CDP3 is electrically connected to the upper touch sensing member pad PD-TSU on the pad area AR-PD. Here, the third conductive pattern CDP3 may be electrically insulated from the lower touch sensing member pad PD-TSD.

Referring to FIGS. 9 and 13B, the touch sensing member TS includes first touch patterns TE1-1 to TE1-3 and second touch patterns TE2-1 to TE2-2, which are disposed on the active area AR-ACV, a touch sensing member pad PD-TS disposed on the pad area AR-PD, and touch signal lines SL1 and SL2 electrically connecting the touch patterns TE1-1 to TE1-3 and TE2-1 to TE2-2 to the touch sensing member pad PD-TS.

The touch sensing member pad PD-TS may include a lower touch sensing member pad PD-TSD and an upper touch sensing member pad PD-TSU. The upper touch sensing member pad PD-TSU is electrically connected to the touch patterns TE1-1 to TE1-3 and TE2-1 to TE2-2 through the touch signal lines SL1 and SL2 and the third conductive pattern CDP3. That is, the upper touch sensing member pad PD-TSU is electrically connected to the sensing patterns SP1 and SP2 through the touch signal lines SL1 and SL2 and the third conductive pattern CDP3.

The lower touch sensing member pad PD-TSD may be electrically insulated from the upper touch sensing member pad PD-TSU. However, the embodiment of the inventive concept is not limited thereto. According to another embodiment of the inventive concept, the lower touch sensing member pad PD-TSD may be electrically connected to the upper touch sensing member pad PD-TSU.

The upper touch sensing member pad PD-TSU is disposed on the lower touch sensing member pad PD-TSD. The upper touch sensing member pad PD-TSU may be disposed at a height that increases by a thickness of the lower touch sensing member pad PD-TSD.

In FIG. 13B, the third conductive pattern CDP3 is not electrically connected to the first conductive pattern CDP1, unlike the third conductive pattern CDP3 of FIG. 13. However, the embodiment of the inventive concept is not limited thereto. For example, as necessary, the third conductive pattern CDP3 and the first conductive pattern CDP1 of FIG. 14 may be electrically connected to each other.

In FIG. 13B, descriptions with respect to other components will be omitted because the components are substantially the same as those of FIG. 13A.

A length HH1 measured from the base layer SUB to the upper display panel pad PD-DPU is substantially the same as that HH2 measured from the base layer SUB to the upper touch sensing member pad PD-TSU.

Although not shown, in another embodiment of the inventive concept, at least one of the touch inorganic layer IL-T or the insulation patterns IL-P may be disposed on the boundary area AR-BD. That is, in this case, at least one of the touch inorganic layer IL-T and the insulation pattern IL-P may be disposed on an entire surface of the active area AR-ACV, the pad area AR-PD, and the boundary area AR-BD.

Referring to FIG. 13C, the upper display panel pad PD-DPU and the upper touch sensing member pad PD-TSU may be disposed on the same layer. The upper display panel pad PD-DPU may be electrically connected to the lower display panel pad PD-DPD through a sixth through hole CH6. Although not shown, a dummy electrode may be disposed on the first insulation layer 12.

Thus, in a process in which the printed circuit board is attached to the display panel pad PD-DP and the touch sensing member pad PD-TS, a pressure applied to the pads PD-DP and PD-TS may be same because the display panel pad PD-DP and the touch sensing member pad PD-TS has a same height. Thus, defects occurring in the process in which the printed circuit board is attached may be prevented from occurring. Also, durability against stress applied from the outside may be improved according to the manipulation operation of the flexible display device DD.

Figure 14A:
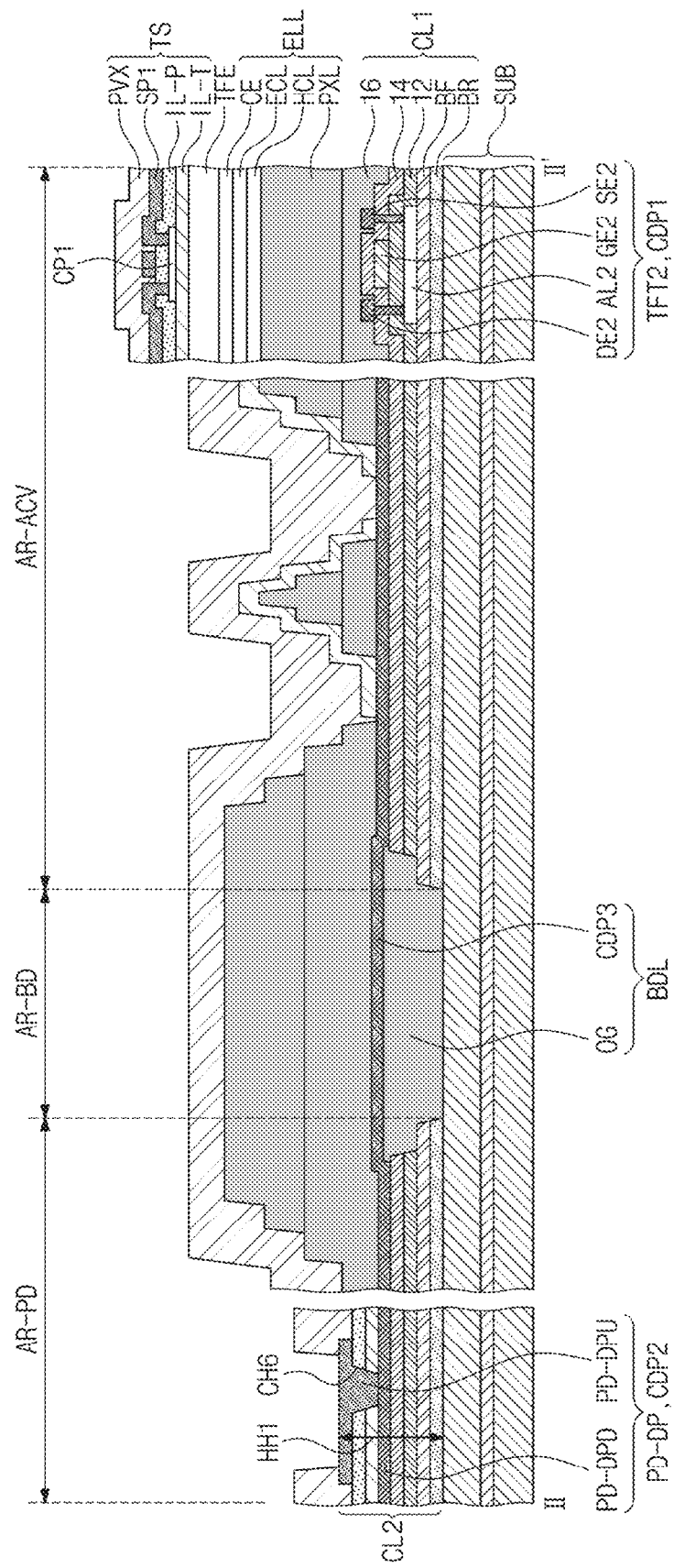
FIG. 14A is a cross-sectional view taken along line II-II' of FIG. 12.
Figure 14B:
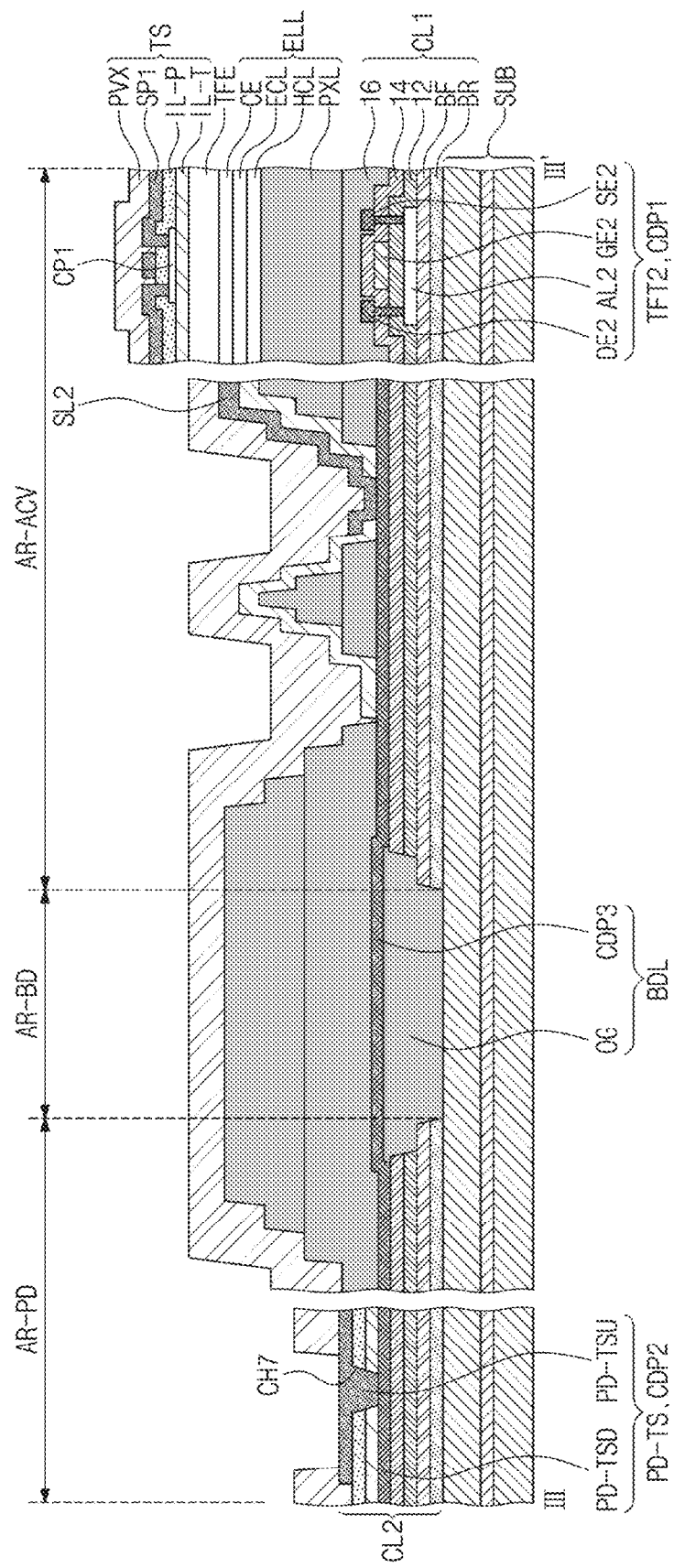
FIG. 14B is a cross-sectional view taken along line III-III' of FIG. 12.
Figure 14C:
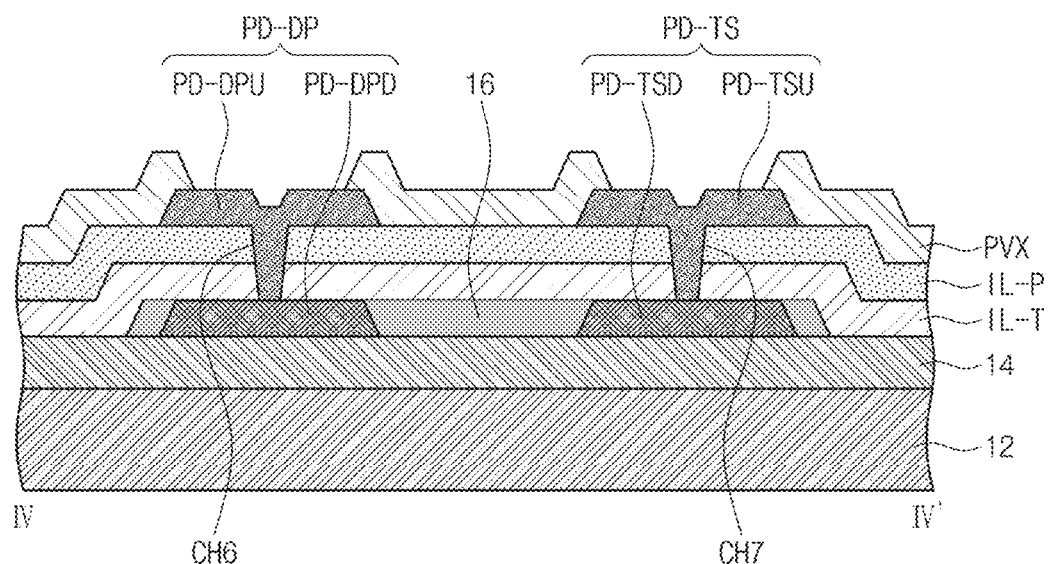
FIGS. 14C and 14D are cross-sectional views taken along line IV-IV' of FIG. 12.
Figure 14D:
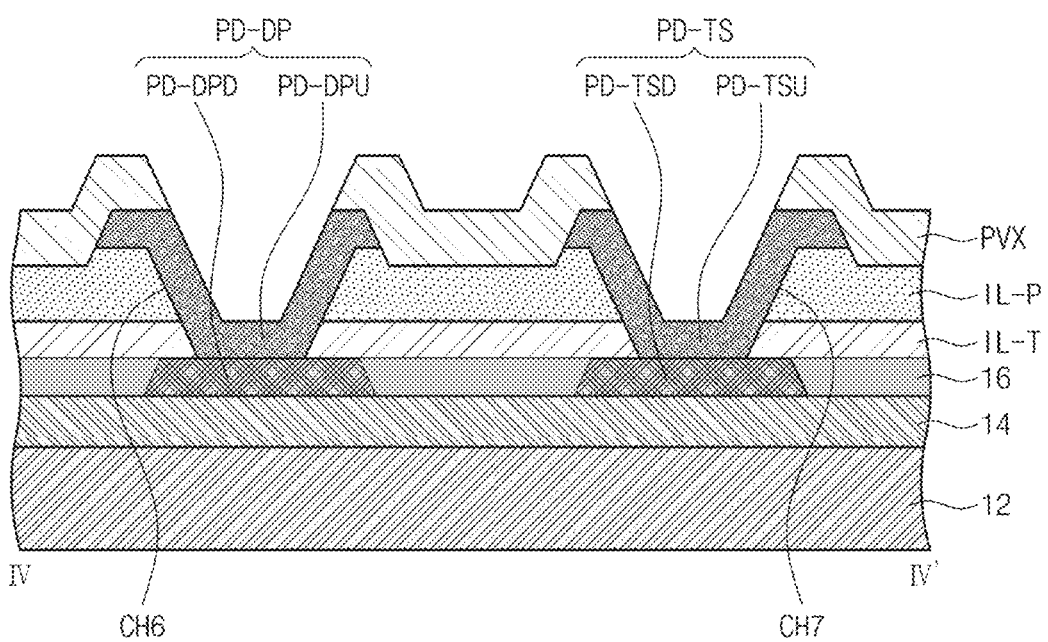

FIG. 14A is a cross-sectional view taken along line II-II' of FIG. 12. FIG. 14B is a cross-sectional view taken along line III-III' of FIG. 12. FIGS. 14C and 14D are cross-sectional views taken along line IV-IV' of FIG. 12, respectively. FIGS. 14A to 14C illustrate an embodiment of the inventive concept.

Descriptions with reference to FIG. 14A are substantially the same as those with reference to FIG. 13A and thus will be omitted.

Referring to FIGS. 14B and 14C, the upper touch sensing member pad PD-TSU may be electrically connected to the lower touch sensing member pad PD-TSD through a seventh through hole CH7.

FIG. 14D illustrates a state in which each of the sixth through hole CH6 and the seventh through hole CH7 has a width greater than that of each of the through holes of FIG. 14C.

Descriptions with respect to other components are substantially the same as those of the components of FIGS. 13A to 13C and thus will be omitted.

Figure 15A:
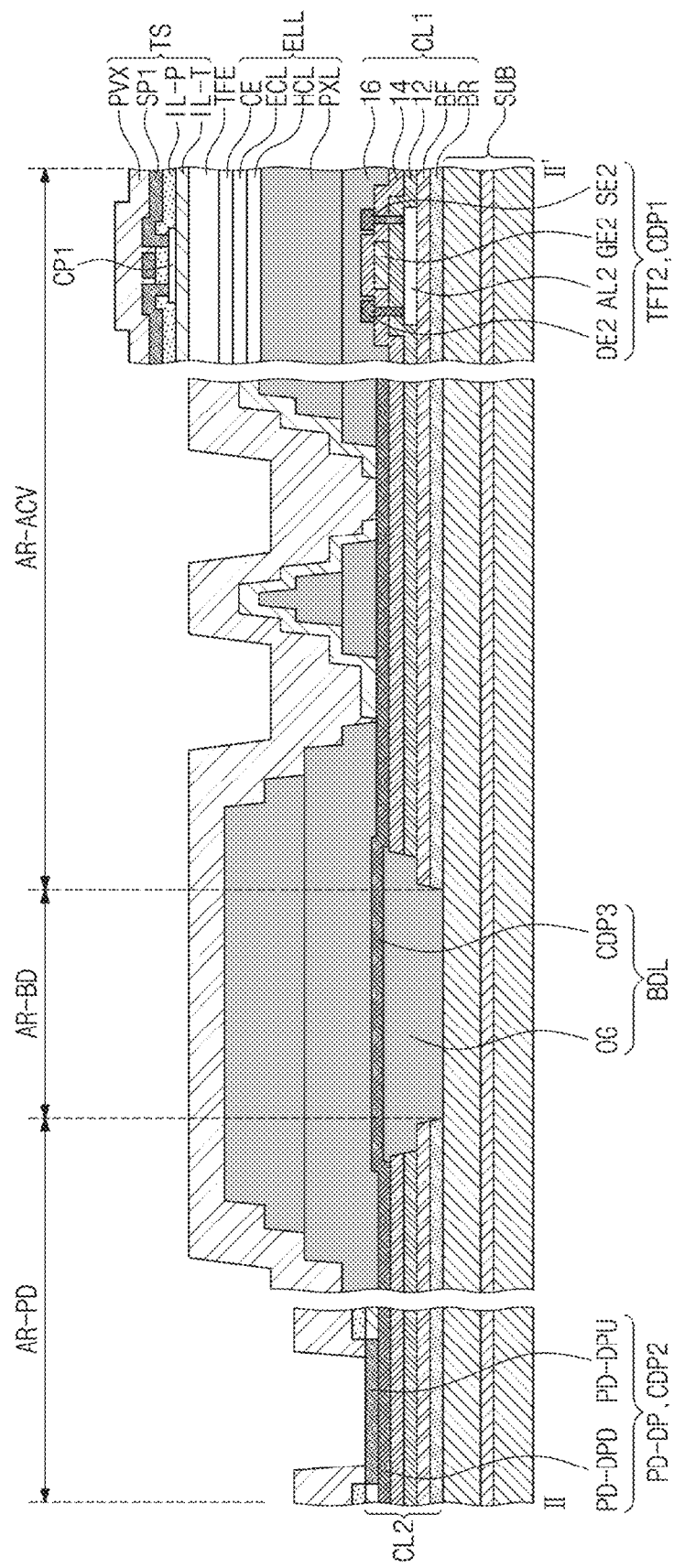
FIG. 15A is a cross-sectional view taken along line II-II' of FIG. 12.
Figure 15B:
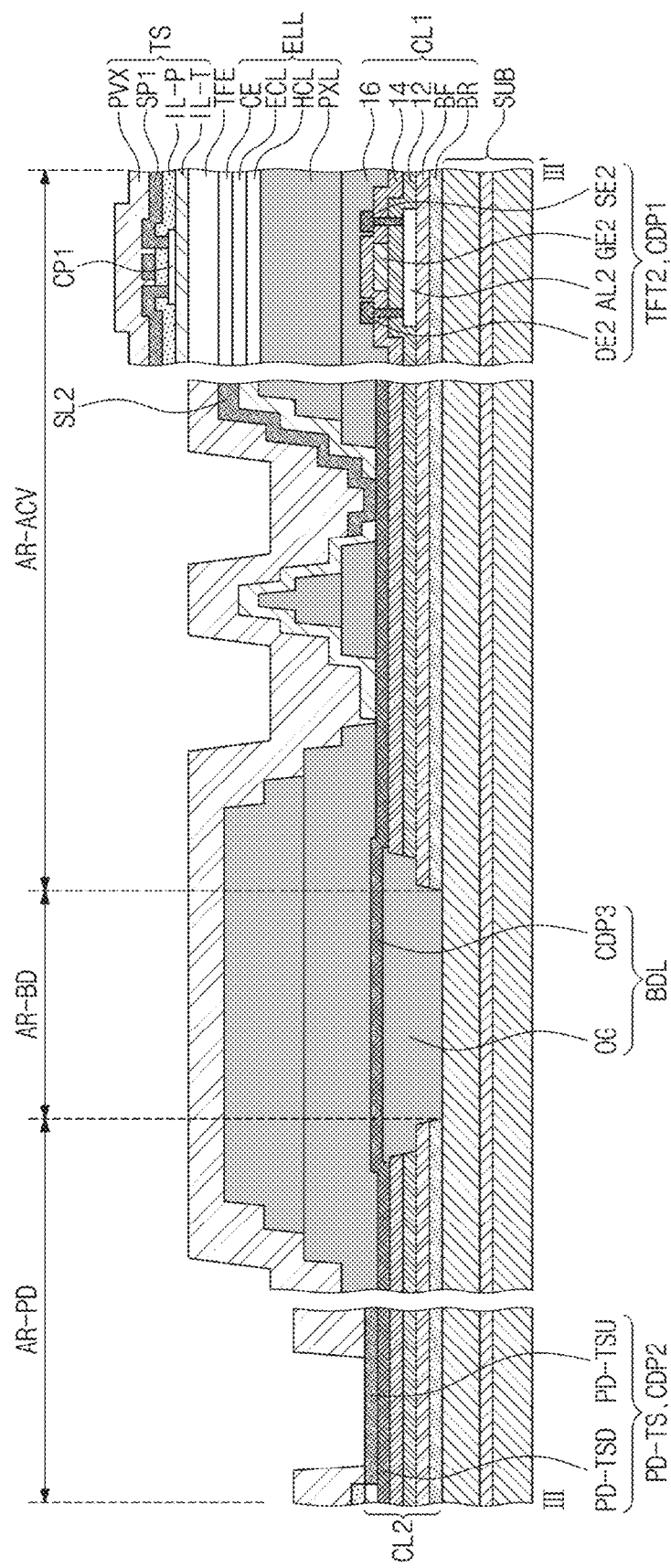
FIG. 15B is a cross-sectional view taken along line III-III' of FIG. 12.
Figure 15C:
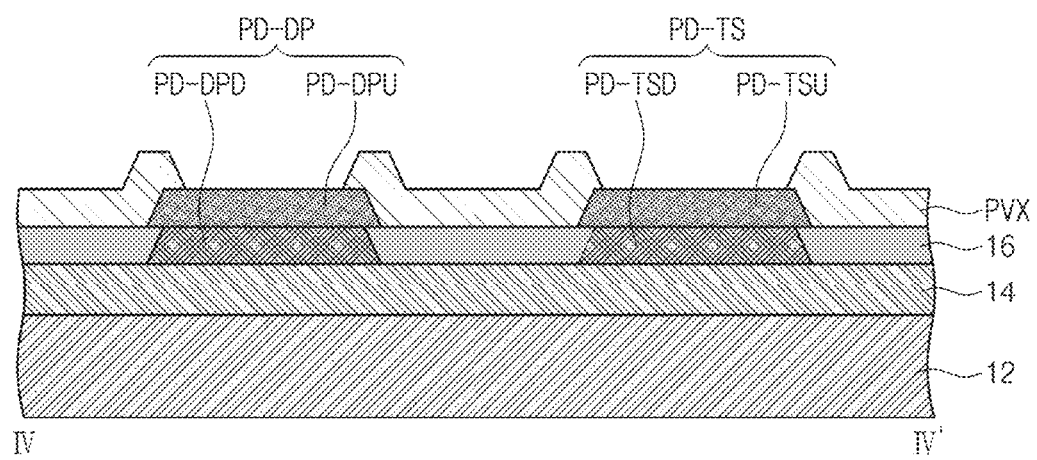
FIG. 15C is a cross-sectional view taken along line IV-IV' of FIG. 12.

FIG. 15A is a cross-sectional view taken along line II-II' of FIG. 12. FIG. 15B is a cross-sectional view taken along line III-III' of FIG. 12. FIG. 15C is a cross-sectional view taken along line IV-IV' of FIG. 12. FIGS. 15A to 15C illustrate an embodiment of the inventive concept.

Referring to FIGS. 15A and 15C, the upper display panel pad PD-DPU contacts the lower display panel pad PD-DPD. Referring to FIGS. 15B and 15C, the upper touch sensing member pad PD-TSU contacts the lower touch sensing member pad PD-TSD.

Descriptions with respect to other components are substantially the same as those of the components of FIGS. 13A to 13C and thus will be omitted.

Figure 16A:
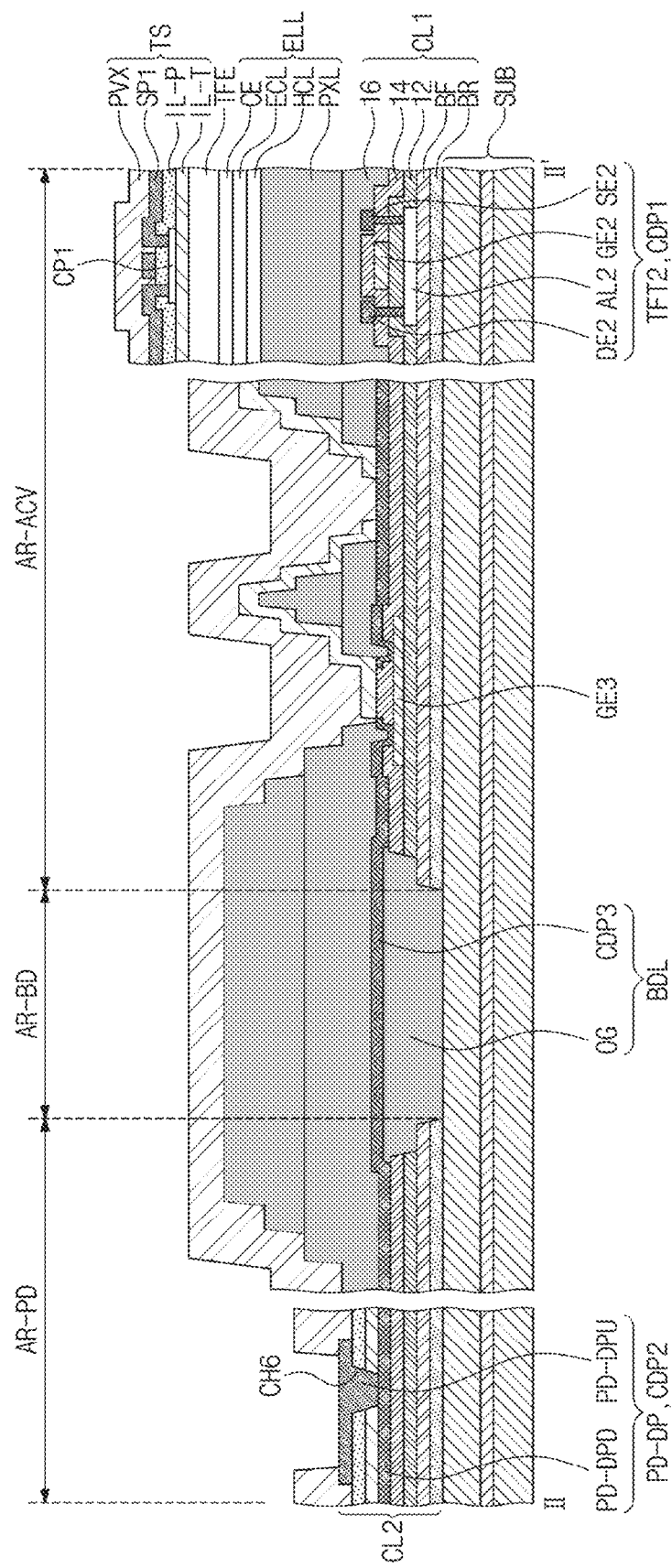
FIG. 16A is a cross-sectional view taken along line II-II' of FIG. 12.
Figure 16B:
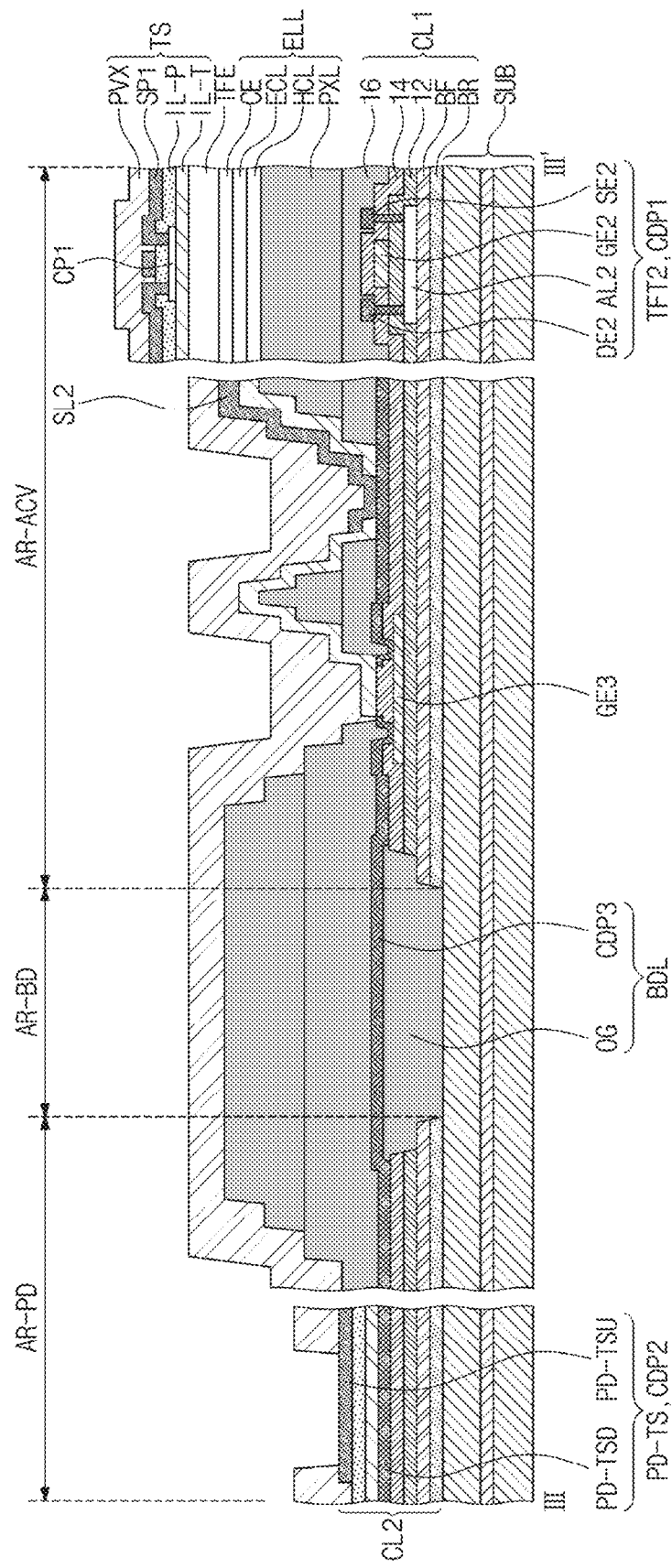
FIG. 16B is a cross-sectional view taken along line III-III' of FIG. 12.
Figure 16C:
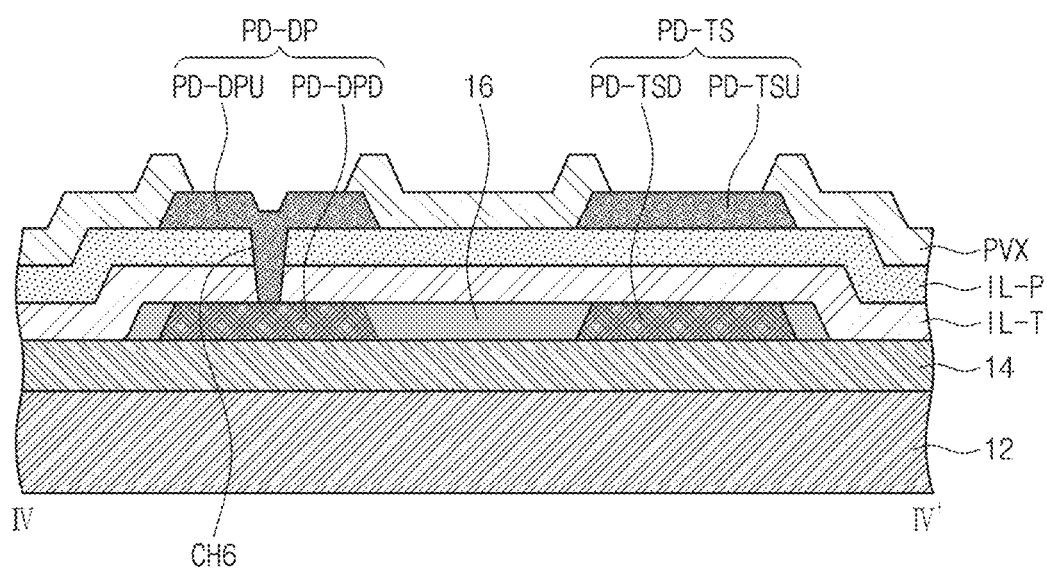
FIG. 16C is a cross-sectional view taken along line IV-IV' of FIG. 12.

FIG. 16A is a cross-sectional view taken along line II-II' of FIG. 12. FIG. 16B is a cross-sectional view taken along line III-III' of FIG. 12. FIG. 16C is a cross-sectional view taken along line IV-IV' of FIG. 12. FIGS. 16A to 16C illustrate an embodiment of the inventive concept.

The third conductive pattern CDP3 of FIGS. 16A and 16B are electrically connected to the first conductive pattern CDP1 through an electrode GE3 that is formed through the same process as the control electrodes GE1 and GE2, unlike the above-described third conductive pattern CDP3.

Descriptions with respect to other components of FIGS. 16A and 16C are substantially the same as those of the components of FIGS. 13A and 13B and thus will be omitted. Descriptions with reference to FIG. 16C are substantially the same as those with reference to FIG. 13C and thus will be omitted.

Figure 17A:
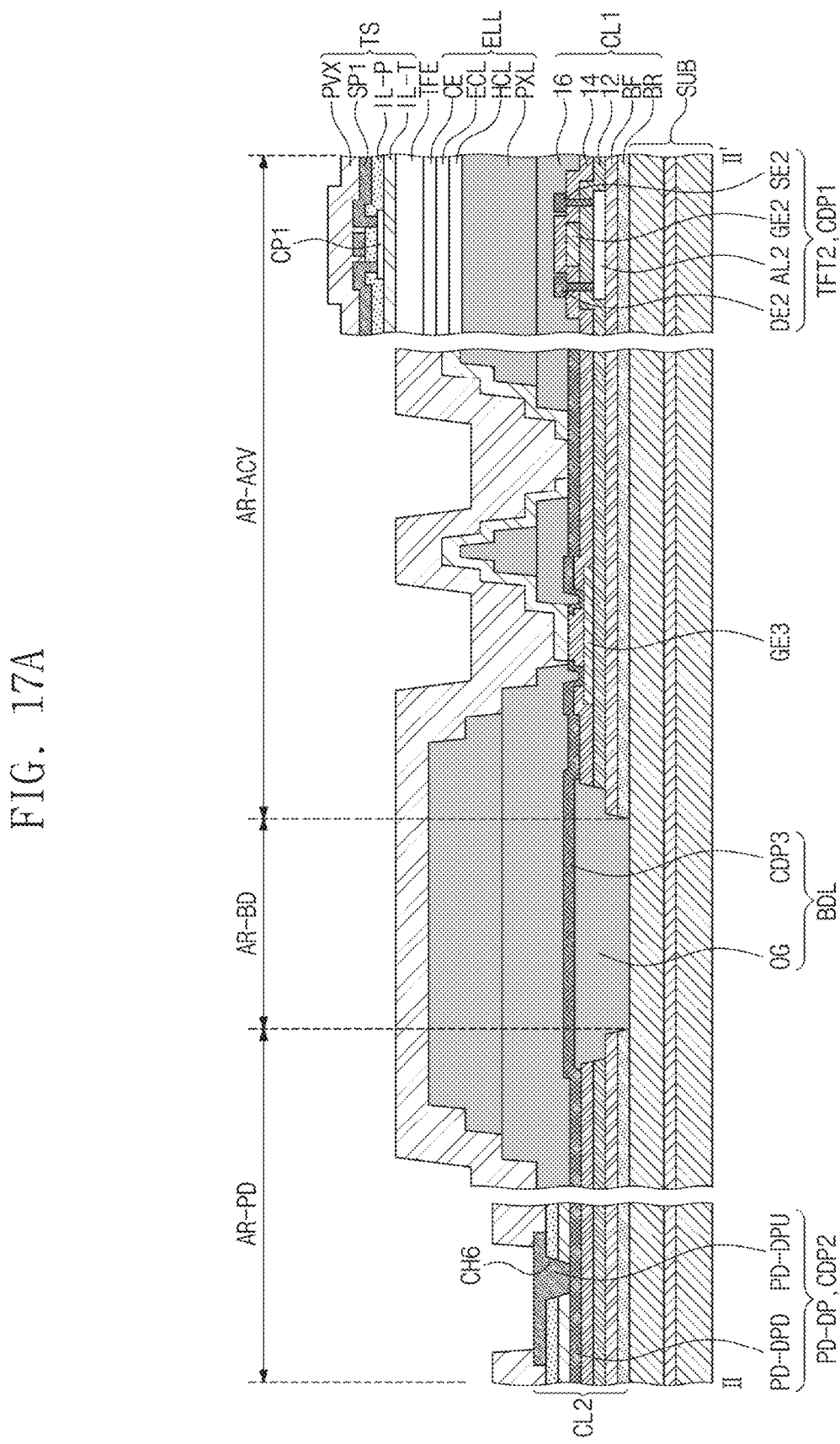
FIG. 17A is a cross-sectional view taken along line II-II' of FIG. 12.
Figure 17B:
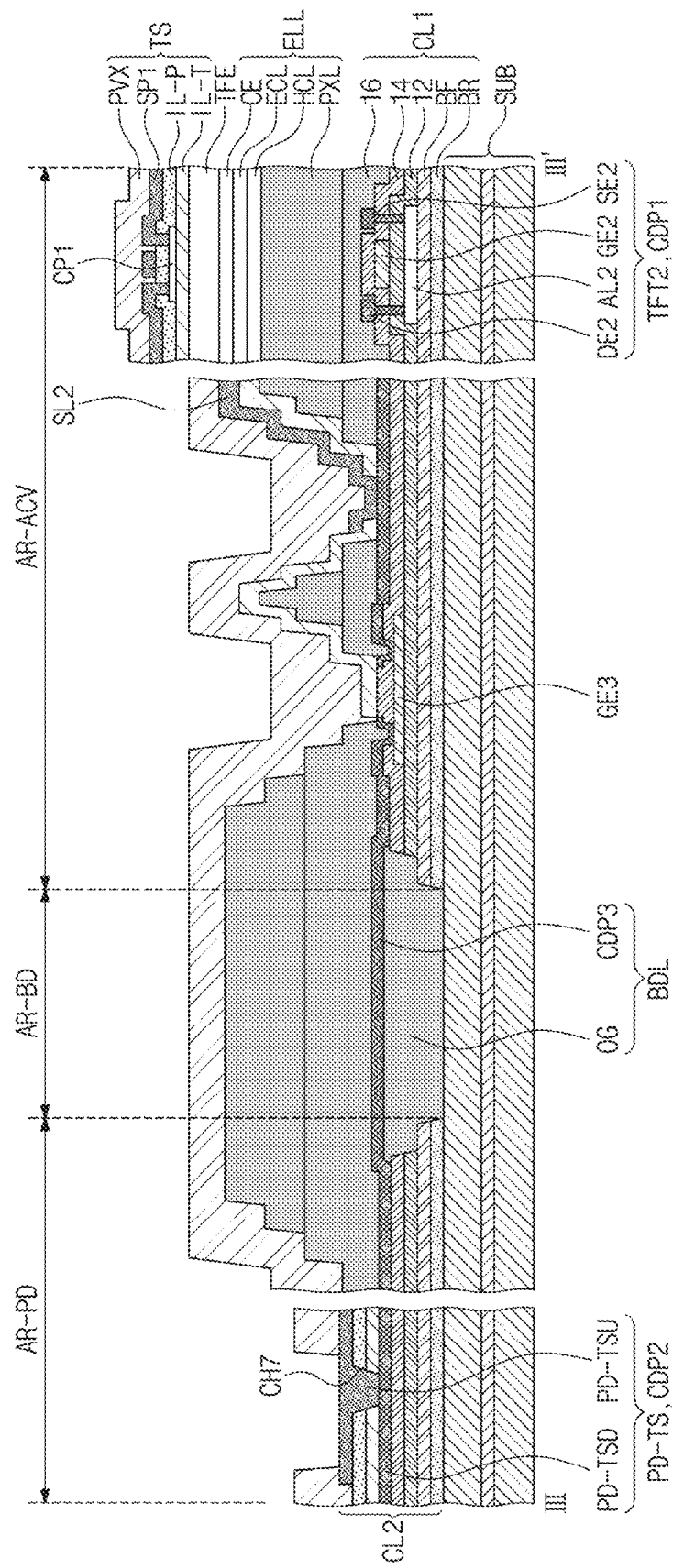
FIG. 17B is a cross-sectional view taken along line III-III' of FIG. 12.
Figure 17C:
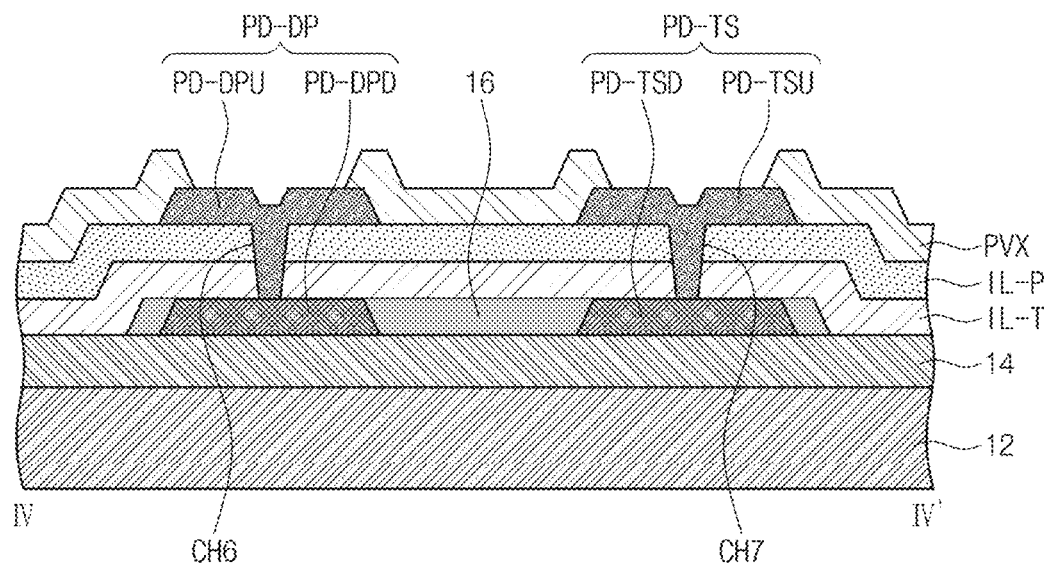
FIGS. 17C and 17D are cross-sectional views taken along line IV-IV' of FIG. 12.
Figure 17D:
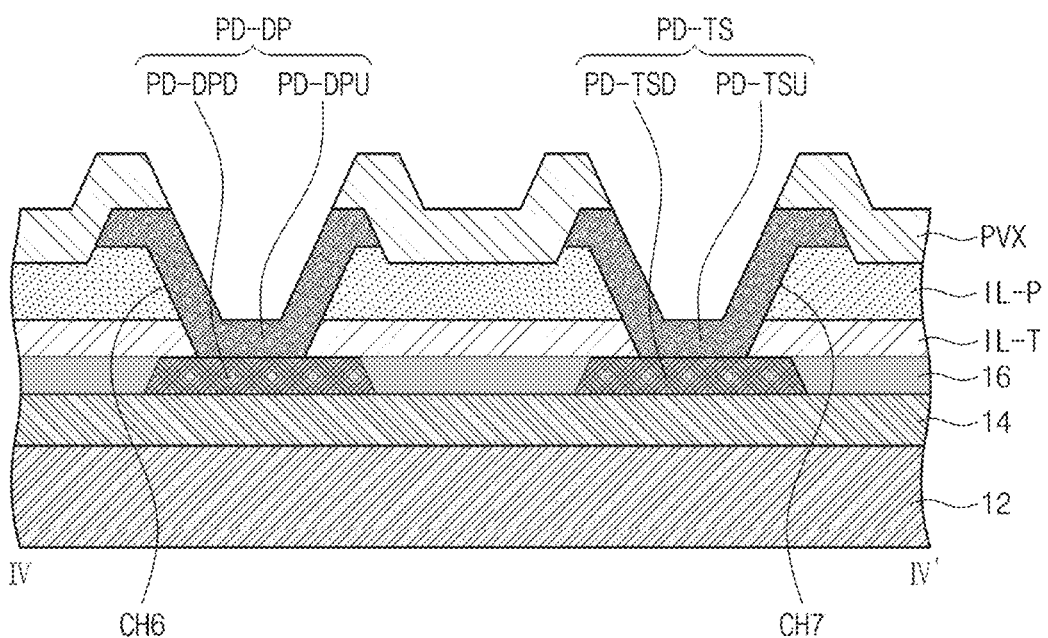

FIG. 17A is a cross-sectional view taken along line II-II' of FIG. 12. FIG. 17B is a cross-sectional view taken along line III-III' of FIG. 12. FIGS. 17C and 17D are cross-sectional views taken along line IV-IV' of FIG. 12. FIGS. 17A to 17D illustrate an embodiment of the inventive concept.

The third conductive pattern CDP3 of FIGS. 17A and 17B are electrically connected to the first conductive pattern CDP1 through the electrode GE3 that is formed through the same process as the control electrodes GE1 and GE2.

Descriptions with respect to other components of FIGS. 17A and 17B are substantially the same as those of the components of FIGS. 14A and 14B and thus will be omitted. Descriptions with reference to FIGS. 17C and 17D are substantially the same as those with reference to FIGS. 14C and 14D and thus will be omitted.

Figure 18A:
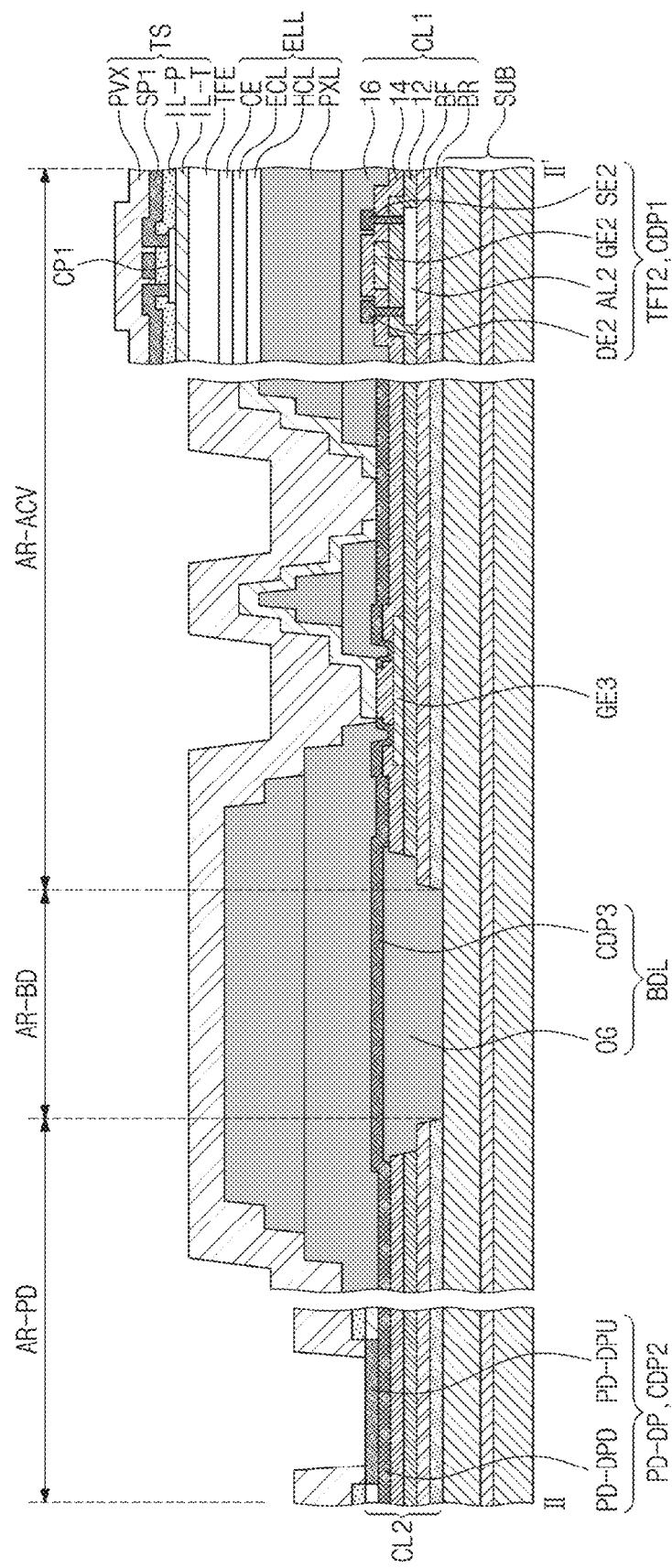
FIG. 18A is a cross-sectional view taken along line II-II' of FIG. 12.
Figure 18B:
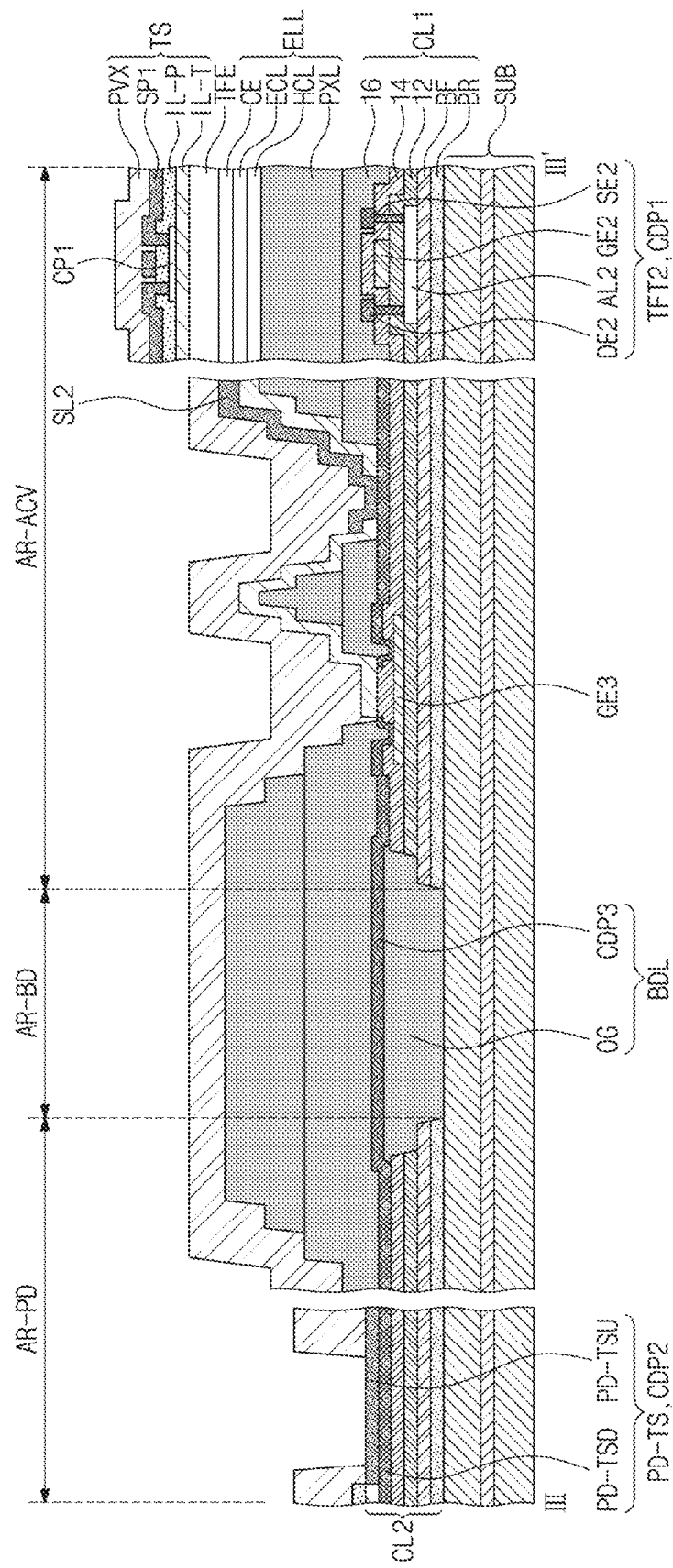
FIG. 18B is a cross-sectional view taken along line III-III' of FIG. 12.
Figure 18C:
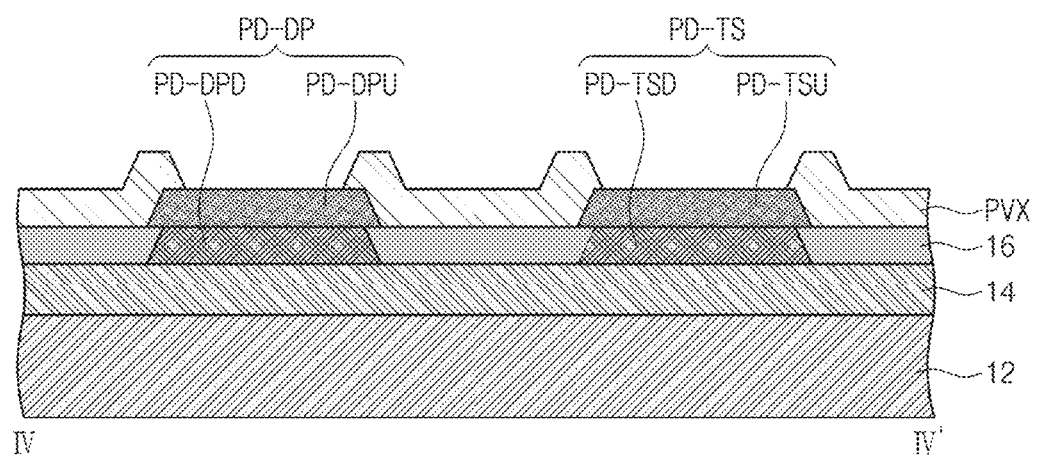
FIG. 18C is a cross-sectional view taken along line IV-IV' of FIG. 12.

FIG. 18A is a cross-sectional view taken along line II-II' of FIG. 12. FIG. 18B is a cross-sectional view taken along line III-III' of FIG. 12. FIG. 18C is a cross-sectional view taken along line IV-IV' of FIG. 12. FIGS. 18A to 18C illustrate an embodiment of the inventive concept.

The third conductive pattern CDP3 of FIGS. 18A and 18B are electrically connected to the first conductive pattern CDP1 through the electrode GE3 that is formed through the same process as the control electrodes GE1 and GE2.

Descriptions with respect to other components of FIGS. 18A and 18B are substantially the same as those of the components of FIGS. 15A and 15B and thus will be omitted. Descriptions with respect to FIG. 18C are substantially the same as those with respect to FIG. 15C and thus will be omitted.

Figure 19A:
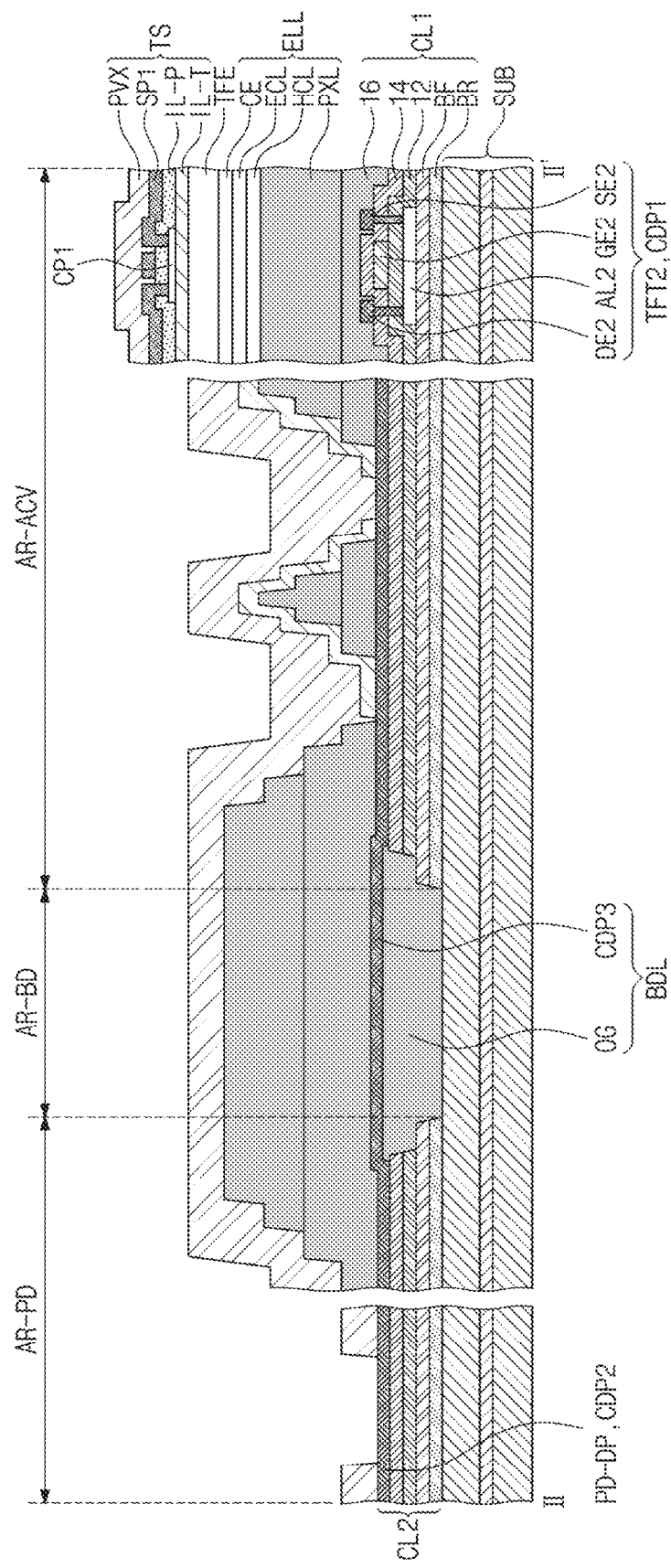
FIG. 19A is a cross-sectional view taken along line II-II' of FIG. 12.
Figure 19B:
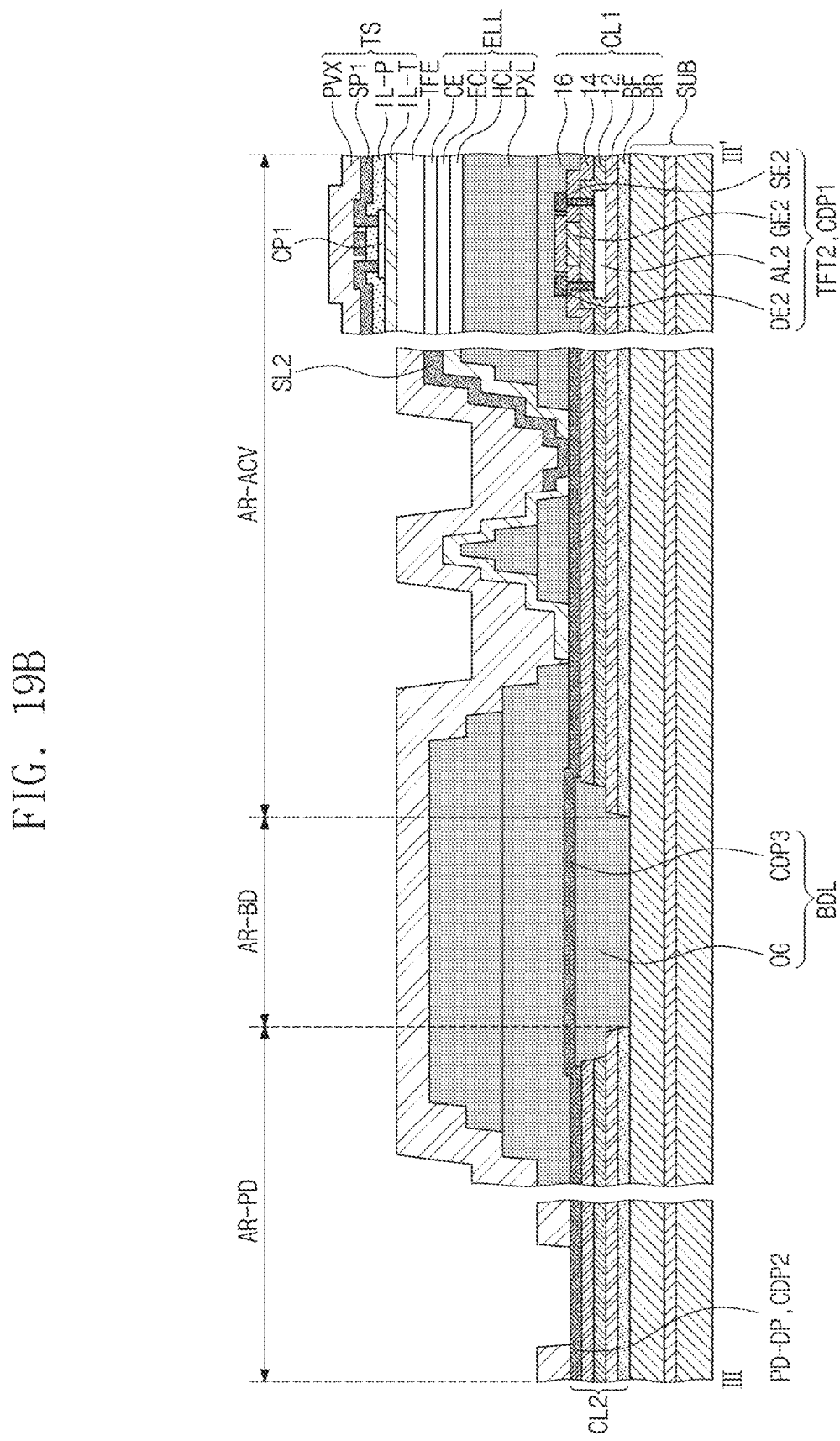
FIG. 19B is a cross-sectional view taken along line III-III' of FIG. 12.
Figure 19C:
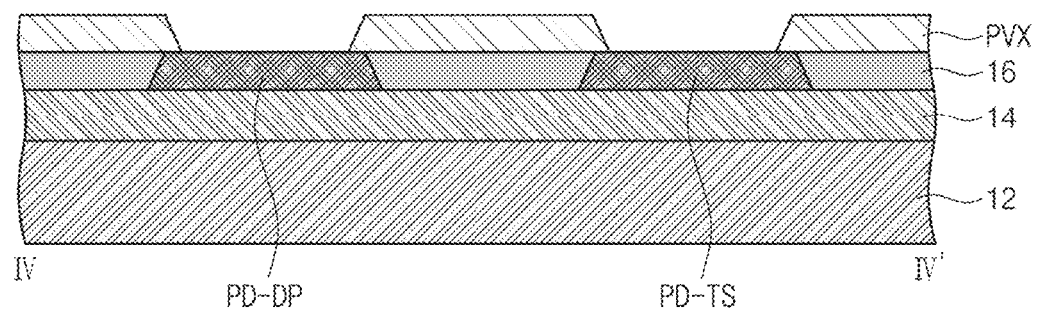
FIG. 19C is a cross-sectional view taken along line IV-IV' of FIG. 12.

FIG. 19A is a cross-sectional view taken along line II-II' of FIG. 12. FIG. 19B is a cross-sectional view taken along line III-III' of FIG. 12. FIG. 19C is a cross-sectional view taken along line IV-IV' of FIG. 12. FIGS. 19A to 19C illustrate an embodiment of the inventive concept.

Referring to FIGS. 19A and 19C, the display panel pad PD-DP has a single layered structure. Referring to FIGS. 19B and 19C, the touch sensing member pad PD-TS has a single layered structure.

Descriptions with respect to other components are substantially the same as those of the components of FIGS. 13A to 13C and thus will be omitted.

Figure 20A:
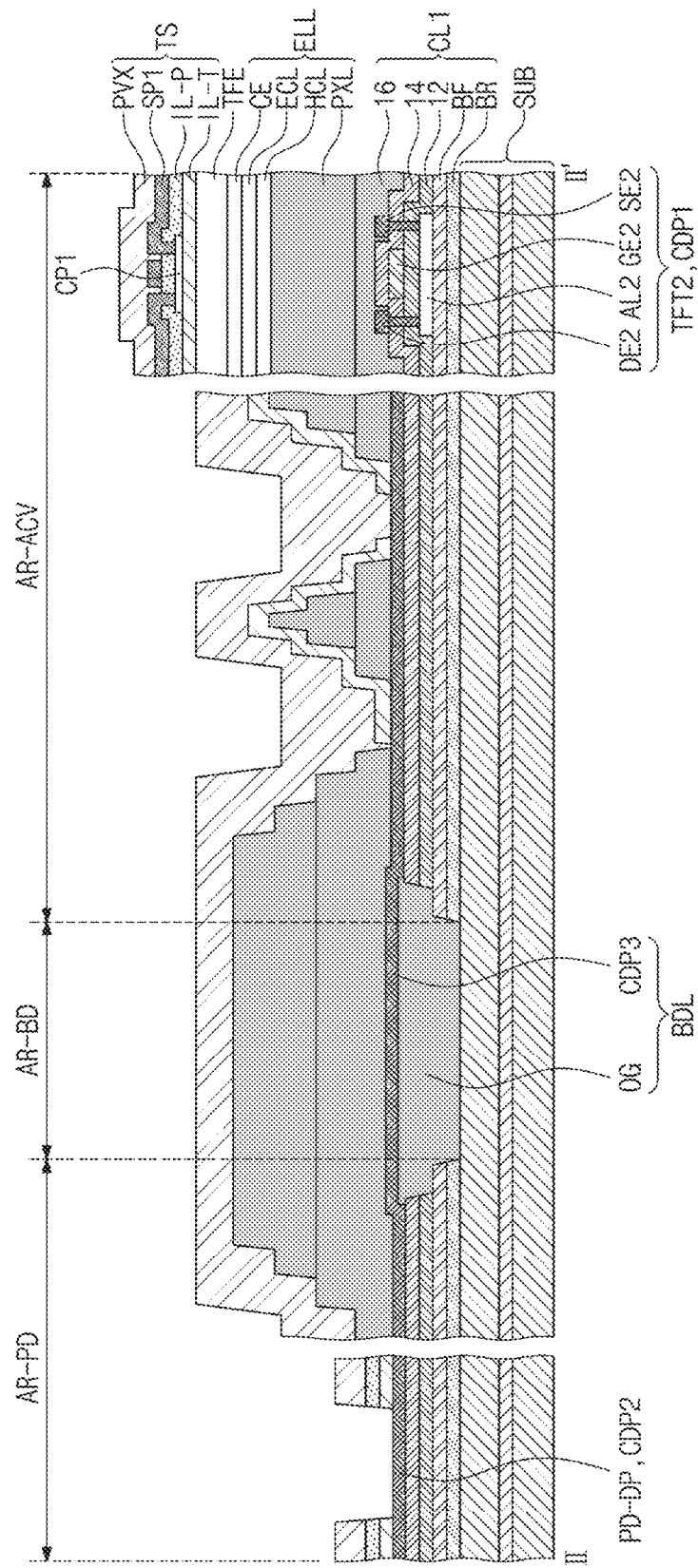
FIG. 20A is a cross-sectional view taken along line II-II' of FIG. 12.
Figure 20B:
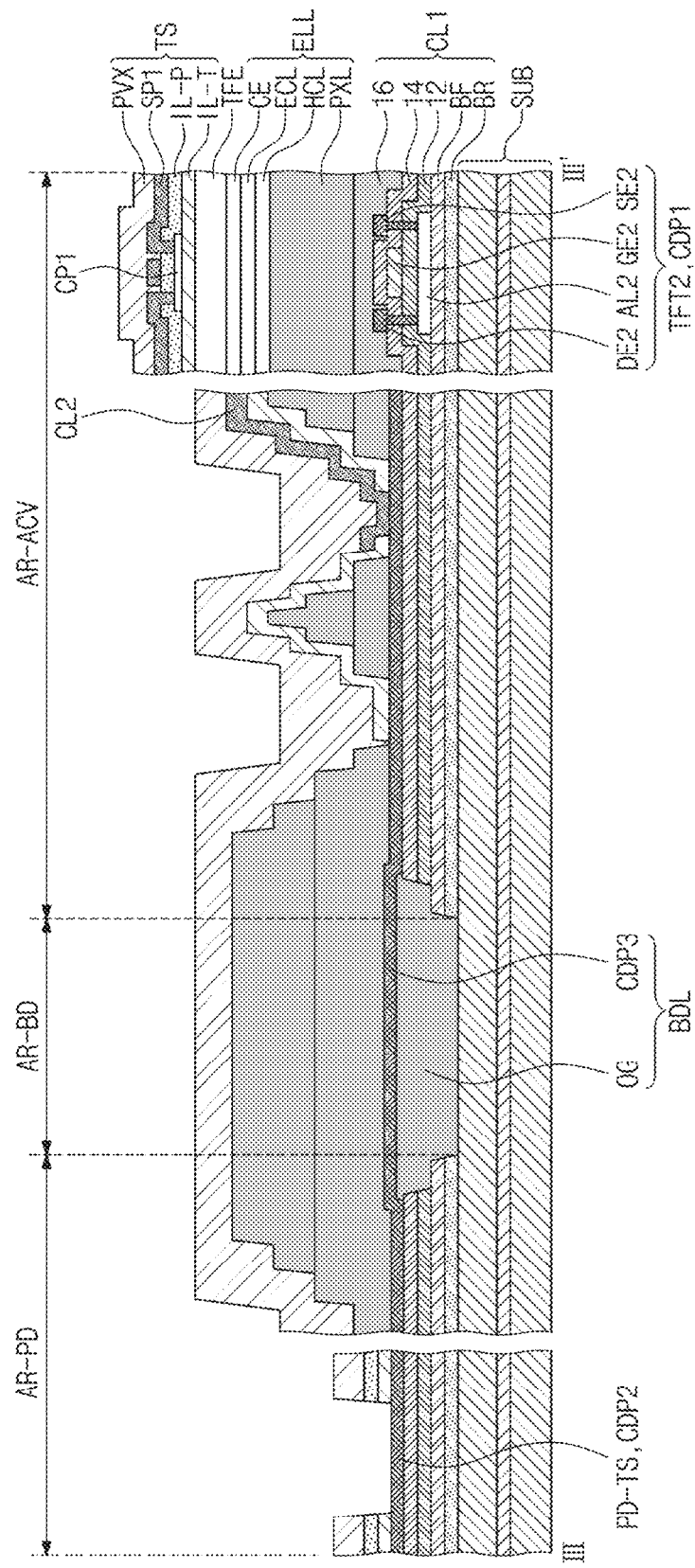
FIG. 20B is a cross-sectional view taken along line III-III' of FIG. 12.
Figure 20C:
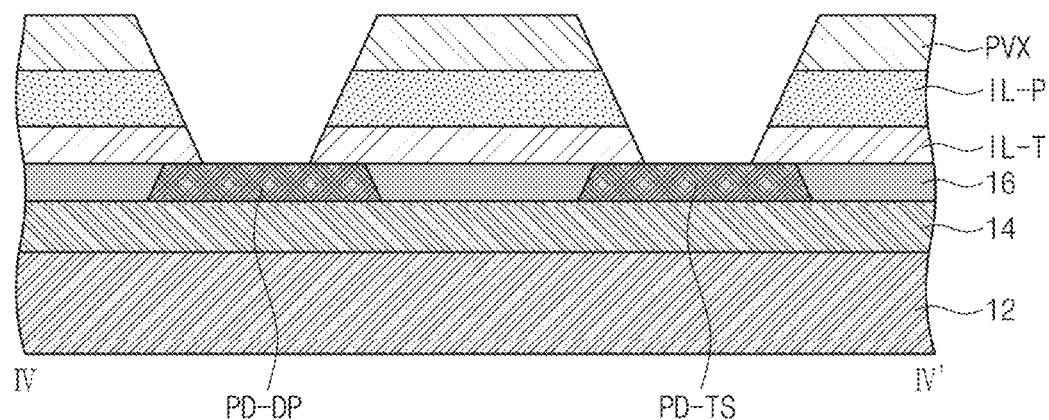
FIG. 20C is a cross-sectional view taken along line IV-IV' of FIG. 12.

FIG. 20A is a cross-sectional view taken along line II-II' of FIG. 12. FIG. 20B is a cross-sectional view taken along line III-III' of FIG. 12. FIG. 20C is a cross-sectional view taken along line IV-IV' of FIG. 12. FIGS. 20A to 20C illustrate an embodiment of the inventive concept.

Referring to FIGS. 20A and 20C, the display panel pad PD-DP has a single layered structure. Referring to FIGS. 20B and 20C, the touch sensing member pad PD-TS has a single layered structure.

Descriptions with respect to other components are substantially the same as those of the components of FIGS. 20A and 20C and thus will be omitted.

As illustrated in FIGS. 19A to 19C and 20A to 20C according to an embodiment of the inventive concept, since the display panel pad PD-DP and the touch sensing member pad PD-TS are disposed at the same height with the single layered structure, the defects that may occur in the manufacturing process may be reduced.

Figure 21A:
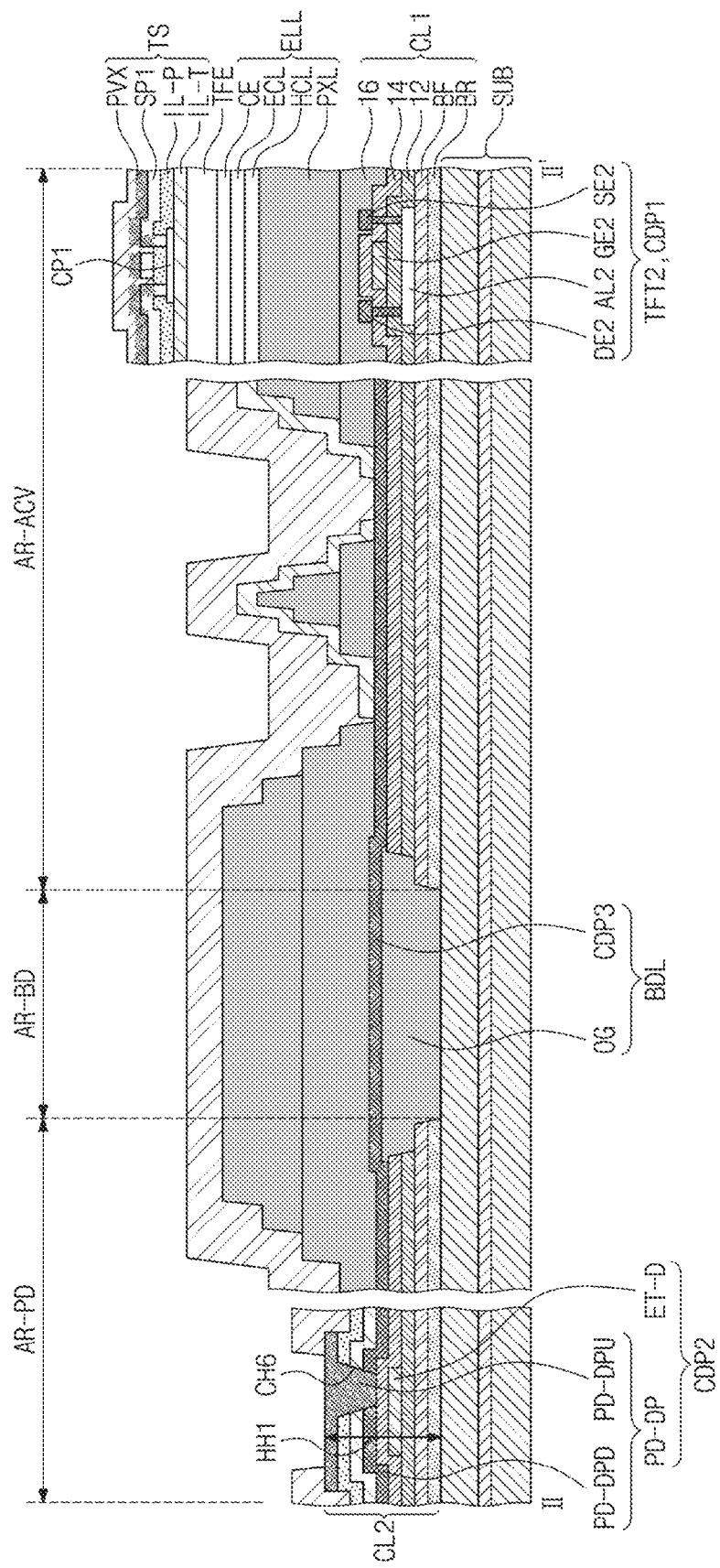
FIG. 21A is a cross-sectional view taken along line II-II' of FIG. 12.
Figure 21B:
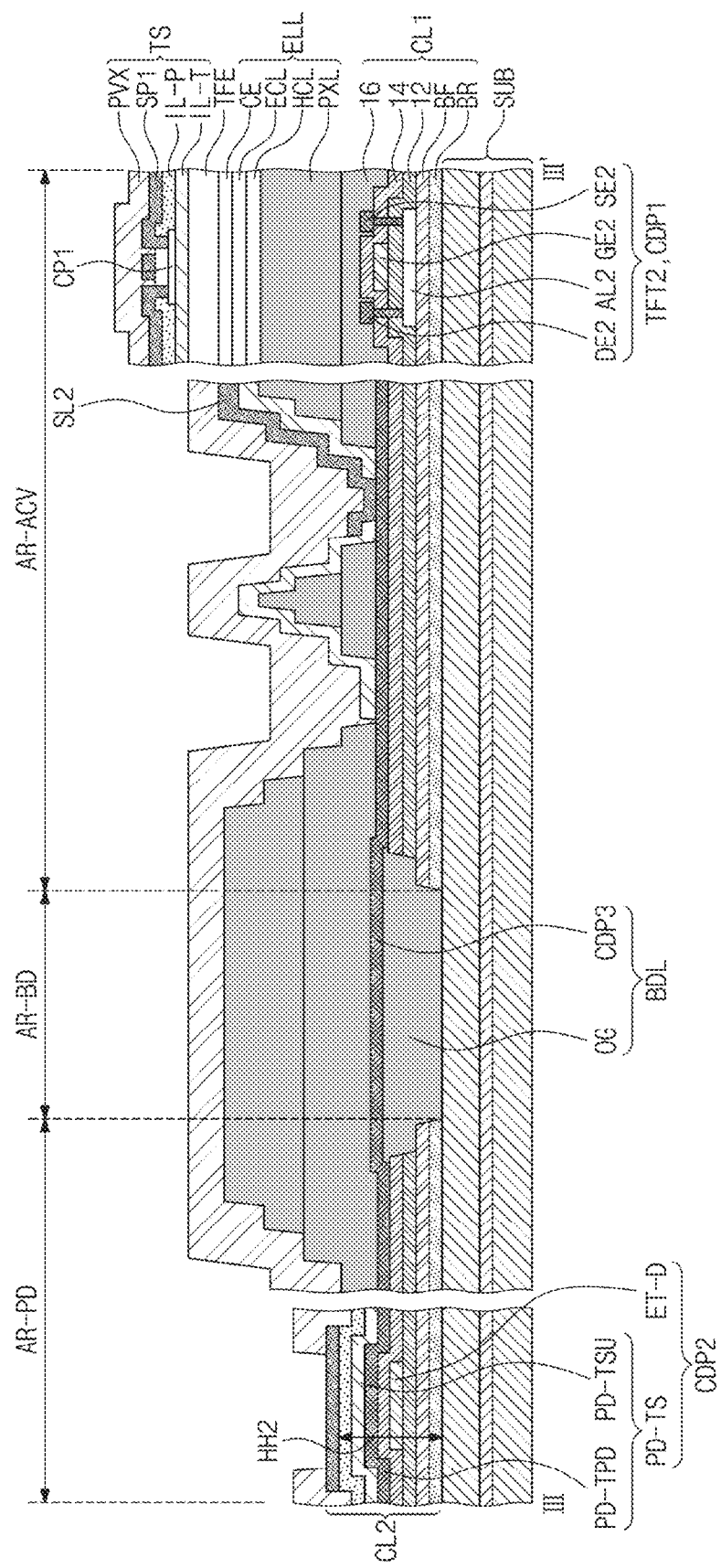
FIG. 21B is a cross-sectional view taken along line III-III' of FIG. 12.
Figure 21C:
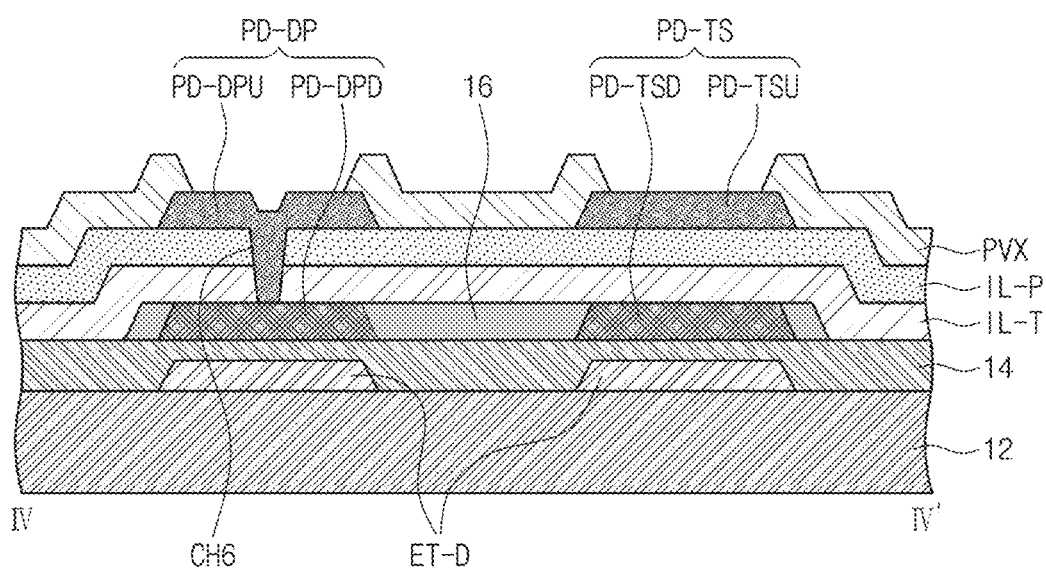
FIG. 21C is a cross-sectional view taken along line IV-IV' of FIG. 12.

FIG. 21A is a cross-sectional view taken along line II-II' of FIG. 12. FIG. 21B is a cross-sectional view taken along line III-III' of FIG. 12. FIG. 21C is a cross-sectional view taken along line IV-IV' of FIG. 12. FIGS. 21A to 21C illustrate an embodiment of the inventive concept.

The second conductive pattern CDP2 may include a dummy electrode ET-D, a display panel pad PD-DP, and a touch sensing member pad PD-TS.

The dummy electrode ET-D may include the same material as the control electrode GE2 of the first circuit layer CL1. The dummy electrode ET-D may be formed through the same process as the control electrode GE2. The dummy electrode ET-D may be insulated from other electrodes and perform a function for adjusting a height of the display panel pad PD-DP on the pad area AR-PD.

Descriptions with respect to other components are substantially the same as those of the components of FIGS. 13A to 13B and thus will be omitted.

Figure 22:
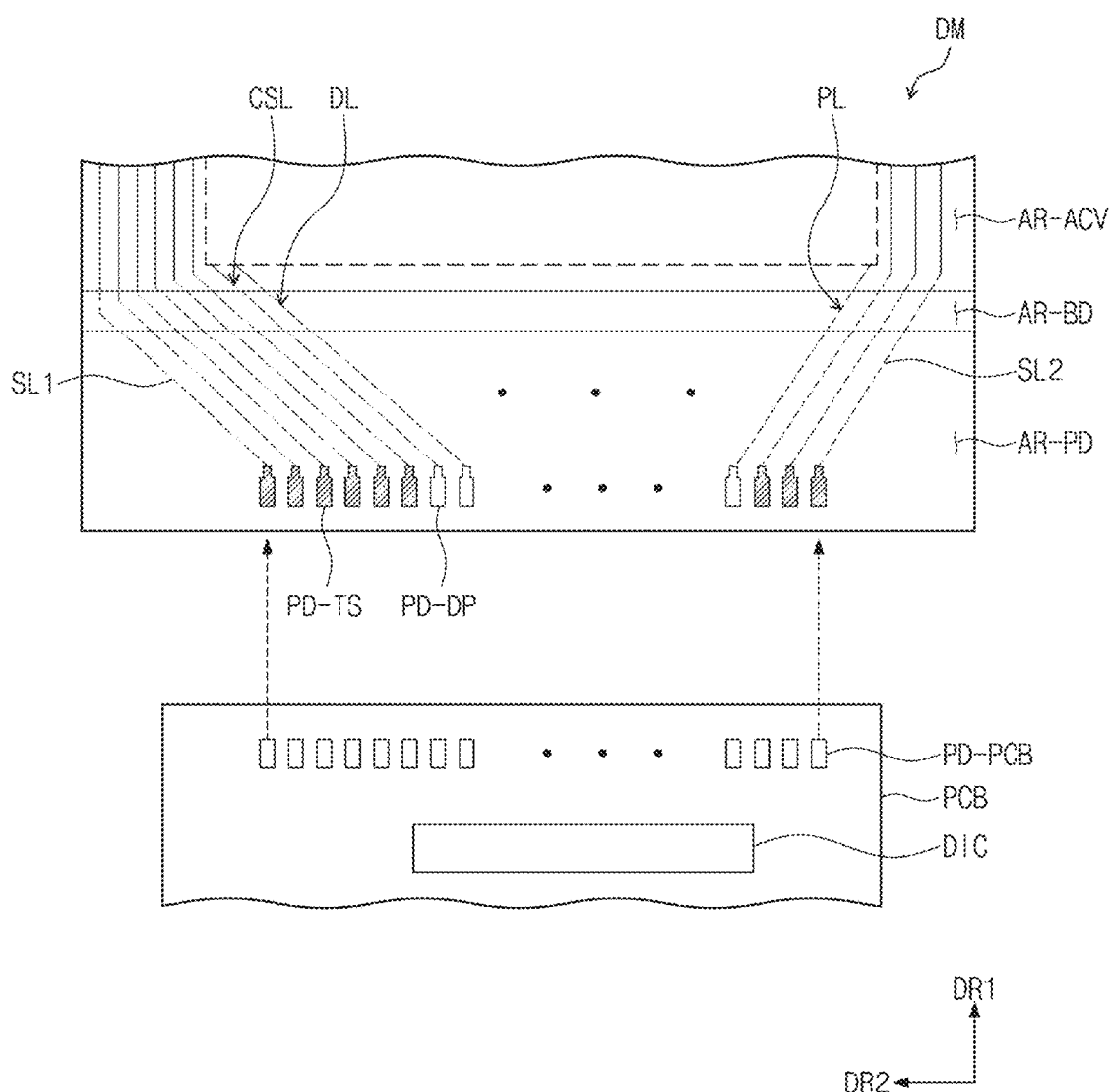
FIGS. 22 and 23 are plan views of a display module and a printed circuit board according to an embodiment of the inventive concept.
Figure 23:
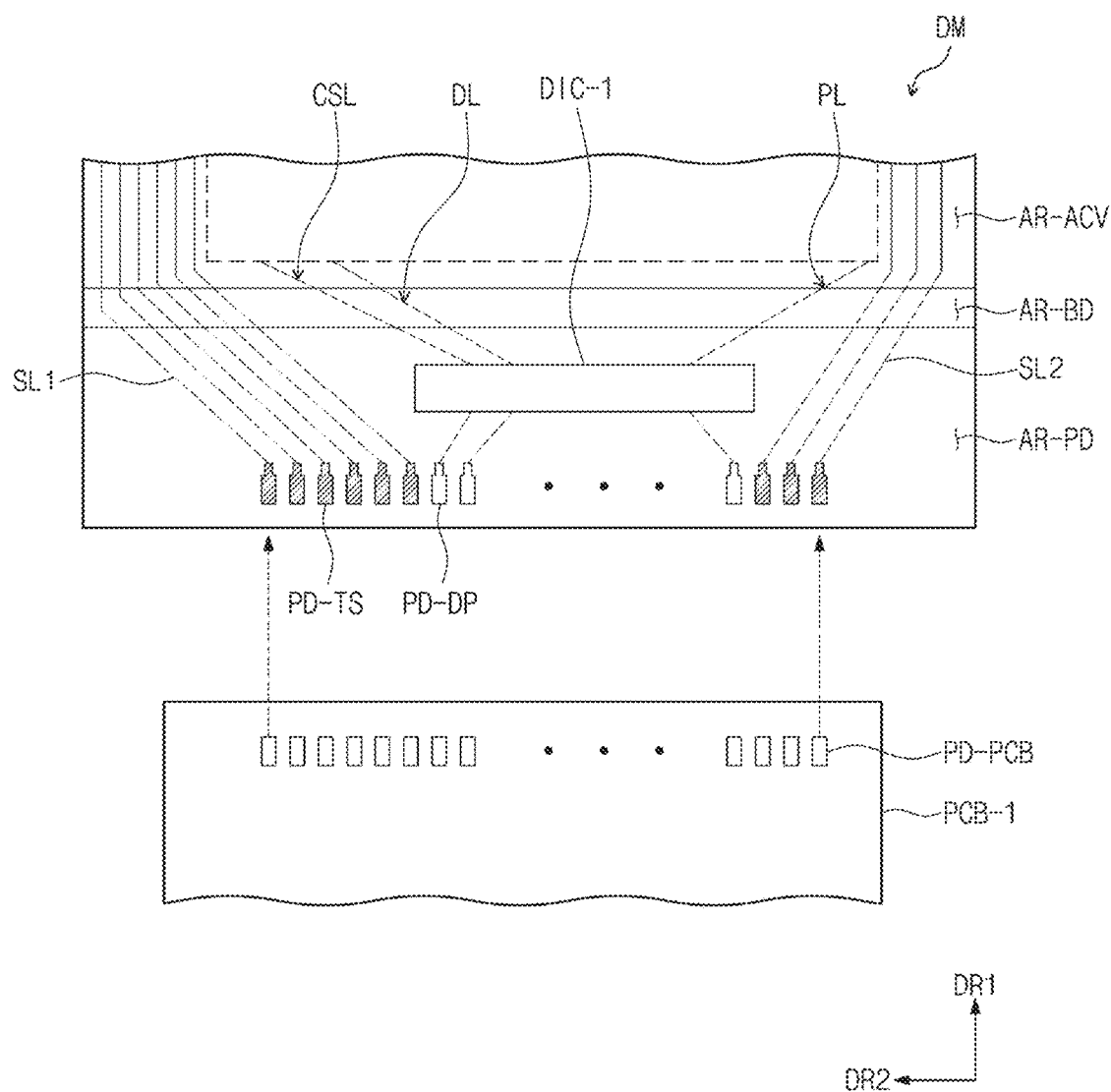

FIGS. 22 and 23 illustrate a display module DM and printed circuit boards PCB and PCB-1 according to an embodiment of the inventive concept.

Referring to FIG. 22, pads PD-TS and PD-DP of the display module DM are electrically connected to pads PD-PCB of the printed circuit board PCB. An integrated circuit DIC may be disposed on the printed circuit board PCB. The integrated circuit DIC may be formed in a chip on flexible printed circuit (COF) manner. The integrated circuit DIC may transmit/receive data information into/from the display module DM through the pads PD-PCB, PD-TS, and PD-DP.

Referring to FIG. 23, an integrated circuit DIC-1 may be disposed on the pad area AR-PD of the display module DM. Here, the integrated circuit DIC-1 may be formed in a chip on plastic (COP) manner.

Although the touch signal lines SL1 and SL2 are not connected to the integrated circuit DIC-1 in FIG. 23, the embodiment of the inventive concept is not limited thereto. In an embodiment of the inventive concept, each of the touch signal lines SL1 and SL2 may have a structure that is connected to the integrated circuit DIC-1.

Figure 24:
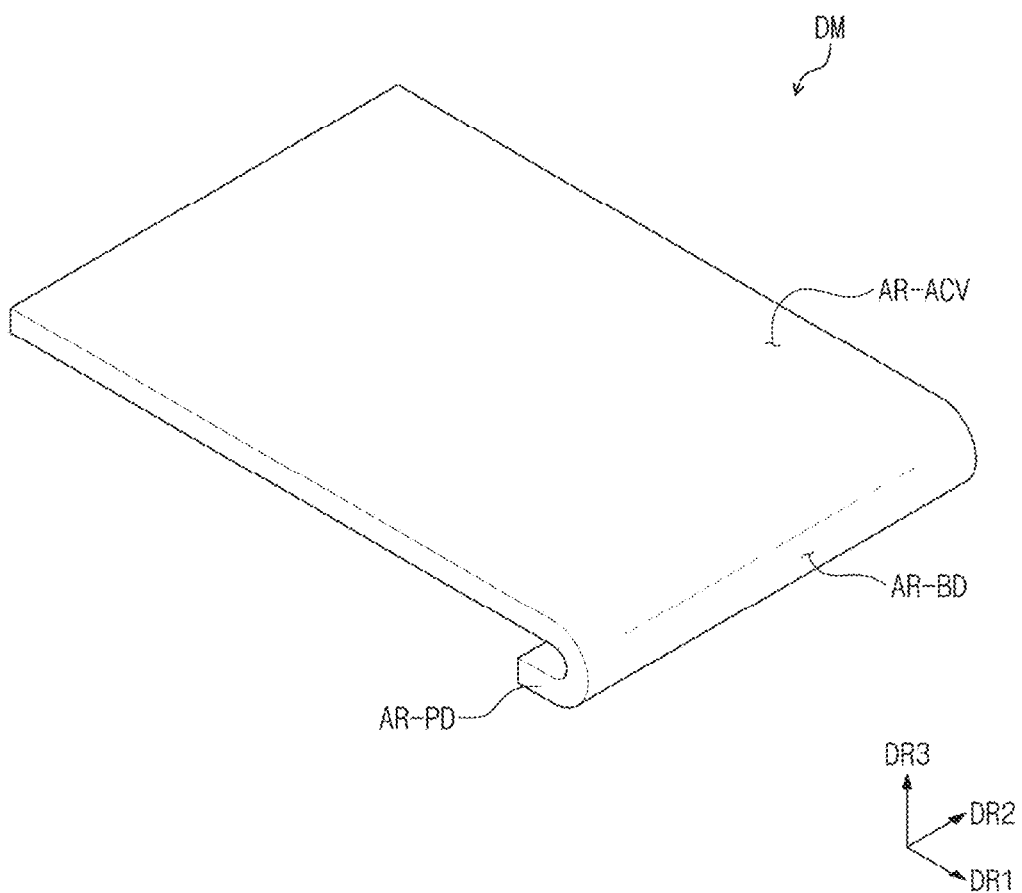
FIG. 24 is a view illustrating a bent shape of the display module according to an embodiment of the inventive concept.

FIG. 24 illustrates a bent shape of the display module DM according to an embodiment of the inventive concept. Referring to FIG. 24, the display module DM may be bent in the boundary area AR-BD. As described above, the boundary area AR-BD of the display module DM may not include an inorganic material layer, but include only an organic material layer. Thus, the boundary area AR-BD may have flexibility that is sufficient to be bent.

According to the embodiment of the inventive concept, the pad unit of the display panel and the pad unit of the touch sensing member may be disposed at the same height.

According to the embodiment of the inventive concept, the bending portion of the display panel may have the improved flexibility.

It will be apparent to those skilled in the art that various modifications and variations can be made in the inventive concept. Thus, it is intended that the present disclosure covers the modifications and variations of this invention provided they come within the scope of the appended claims and their equivalents. Thus, to the maximum extent allowed by law, the scope of the present invention is to be determined by the broadest permissible interpretation of the following claims and their equivalents, and shall not be restricted or limited by the foregoing detailed description.

What is claimed is:

1. A display device comprising:
a base layer including a display area and a non-display area;
a display element layer comprising a display element on the display area;
a touch sensing member disposed on the display element layer and comprising a touch pattern on the display area;
a first pad disposed in the non-display area;
a second pad disposed on the first pad;
an organic layer disposed between the base layer and the second pad, and the organic layer partially covering the first pad; and
an inorganic layer disposed between the organic layer and the second pad, and the inorganic layer exposing at least a portion of the first pad, and
wherein the second pad is electrically connected to one of the display element layer and the touch sensing member.

2. The display device of claim 1, wherein the organic layer is a layer of the display element layer, and wherein the inorganic layer is a layer of the touch sensing member.

3. The display device of claim 2, wherein the organic layer is disposed between the base layer and the display element.

4. The display device of claim 2, wherein the inorganic layer is disposed between the display element and the touch pattern or disposed on the touch pattern.

5. The display device of claim 4, wherein the touch pattern comprises a sensing pattern and a connection pattern disposed on a different layer from the sensing pattern,
wherein the touch sensing member further comprises:
a first insulation layer disposed between the connection pattern and the sensing pattern; and
a second insulation layer disposed between the display element and the first insulation layer, and
wherein the inorganic layer is at least one of the first insulation layer and the second insulation layer.

6. The display device of claim 5, wherein the inorganic layer comprising both of the first insulation layer and the second insulation layer.

7. The display device of claim 6, wherein the second pad disposed on a same layer with the sensing pattern.

8. The display device of claim 1, further comprising an encapsulation layer disposed between the display element layer and the touch sensing member,
wherein the first pad and the second pad are disposed apart from the thin film encapsulation layer.

9. The display device of claim 1, wherein the second pad contacts the portion of the first pad exposed from the inorganic layer.

10. The display device of claim 9, wherein the first pad is electrically connected to the display element and the second pad is insulated from the touch sensing member.

11. The display device of claim 1, wherein the first pad is insulated from the display element layer and the second pad is electrically connected to the touch sensing member.

12. The display device of claim 1, wherein the second pad is electrically connected to the touch sensing member and the first pad is insulated from the second pad.

13. The display device of claim 1, further comprising a floating dummy electrode disposed between the base layer and the first pad, wherein the first pad overlaps the floating dummy electrode in a plan view.

* * * * *

UNITED STATES PATENT AND TRADEMARK OFFICE
CERTIFICATE OF CORRECTION

PATENT NO. : 11,716,891 B2  
APPLICATION NO. : 17/980604  
DATED : August 1, 2023  
INVENTOR(S) : Yong-hwan Park et al.

Page 1 of 1

It is certified that error appears in the above-identified patent and that said Letters Patent is hereby corrected as shown below:

In the Specification

Column 8, Line 42:
"filer" should be changed to --filter--

Signed and Sealed this
Fourth Day of February, 2025

Coke Morgan Stewart
*Acting Director of the United States Patent and Trademark Office*